US012563900B2

(12) United States Patent
Kim

(10) Patent No.: US 12,563,900 B2
(45) Date of Patent: Feb. 24, 2026

(54) DISPLAY DEVICE

(71) Applicant: Samsung Display Co., LTD., Yongin-si (KR)

(72) Inventor: Keun Woo Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/663,815

(22) Filed: May 14, 2024

(65) Prior Publication Data

US 2025/0107329 A1 Mar. 27, 2025

(30) Foreign Application Priority Data

Sep. 27, 2023 (KR) ........................ 10-2023-0130962

(51) Int. Cl.
*G09G 3/3233* (2016.01)
*H10K 59/121* (2023.01)
*H10K 59/131* (2023.01)

(52) U.S. Cl.
CPC ....... *H10K 59/1213* (2023.02); *G09G 3/3233* (2013.01); *H10K 59/131* (2023.02);
(Continued)

(58) Field of Classification Search
CPC ............. H10K 59/1213; H10K 59/131; H10K 59/1216; G09G 3/3233; G09G 2300/0426;
(Continued)

(56) References Cited

U.S. PATENT DOCUMENTS 11,164,526 B2   11/2021  Kim et al.
11,514,855 B2 * 11/2022  Lim ..................... G09G 3/3258
(Continued)

FOREIGN PATENT DOCUMENTS

KR      20160032792 A      3/2016
KR      20200124365 A      11/2020
(Continued)

OTHER PUBLICATIONS

Dictionary.com, "adjacent," in Dictionary.com Unabridged. Source location: Random House, Inc. http://dictionary.reference.com/browse/adjacent, Nov. 18, 2011, p. 1.*
(Continued)

*Primary Examiner* — Jeff Piziali
(74) *Attorney, Agent, or Firm* — CANTOR COLBURN LLP

(57) ABSTRACT

A display device includes a light-emitting element disposed on a substrate, a first transistor configured to control a driving current flowing in the light-emitting element, a second transistor configured to apply a data voltage to a source electrode of the first transistor, a third-first transistor connected to a gate electrode of the first transistor, and a third-second transistor connected between a source electrode of the third-first transistor and a drain electrode of the first transistor. One side of a semiconductor region of the third-second transistor adjacent to a source electrode of the third-second transistor has a first width, and another side of the semiconductor region of the third-second transistor adjacent to a drain electrode of the third-second transistor has a second width smaller than the first width.

9 Claims, 16 Drawing Sheets

(52) U.S. Cl.
CPC ............... *G09G 2300/0426* (2013.01); *G09G 2300/0819* (2013.01); *G09G 2300/0852* (2013.01); *G09G 2300/0861* (2013.01); *G09G 2310/08* (2013.01)

(58) Field of Classification Search
CPC ... G09G 2300/0819; G09G 2300/0852; G09G 2300/0861; G09G 2310/08; G09G 2320/0214

See application file for complete search history.

(56) References Cited

U.S. PATENT DOCUMENTS

| | | | | |
|---|---|---|---|---|
| 11,538,413 | B1 * | 12/2022 | Kim | G09G 3/3233 |
| 11,785,805 | B2 * | 10/2023 | Kim | G09G 3/3258 |
| | | | | 257/40 |
| 2004/0080012 | A1 * | 4/2004 | Kim | H10D 30/69 |
| | | | | 257/E21.21 |
| 2012/0019504 | A1 * | 1/2012 | Han | G09G 3/3233 |
| | | | | 345/212 |
| 2015/0129844 | A1 * | 5/2015 | Kang | H10D 62/117 |
| | | | | 257/43 |
| 2016/0254340 | A1 * | 9/2016 | Kwon | H10D 86/60 |
| | | | | 257/40 |
| 2021/0125543 | A1 * | 4/2021 | Kim | G09G 3/3233 |
| 2021/0210020 | A1 * | 7/2021 | Cho | G09G 3/3266 |
| 2021/0210518 | A1 * | 7/2021 | Tanaka | G09G 3/32 |
| 2021/0280652 | A1 * | 9/2021 | Kim | H10D 30/6731 |
| 2022/0005902 | A1 * | 1/2022 | Han | H10K 59/1213 |
| 2022/0130931 | A1 * | 4/2022 | Lim | H10K 59/1213 |
| 2022/0139966 | A1 * | 5/2022 | Kim | H10D 86/441 |
| | | | | 257/72 |
| 2022/0158051 | A1 * | 5/2022 | Lee | H01L 23/5226 |
| 2024/0107808 | A1 | 3/2024 | Kim et al. | |
| 2024/0112625 | A1 * | 4/2024 | Sang | G09G 3/32 |
| 2024/0145483 | A1 * | 5/2024 | Kim | H10D 86/441 |

FOREIGN PATENT DOCUMENTS

| | | |
|---|---|---|
| KR | 20210113513 A | 9/2021 |
| KR | 20220060031 A | 5/2022 |

OTHER PUBLICATIONS

Bansal, et al., Modeling and Optimization of Fringe Capacitance of Nanoscale DGMOS Devices, IEEE Transactions on Electron Devices, vol. 52, No. 2, Feb. 2005, New York, NY.

Park, et al., Suppression of Leakage Current in Solid-Phase Crystallization Silicon Thin-Film Transistors Employing Off-State-Bias Annealing, Japanese Journal of Applied Physics 48 (2009) 111202, School of Electrical Engineering (#50), Nov. 20, 2009, Seoul National University, San 56-1, Gwanak-gu, Seoul 151-742, Korea.

* cited by examiner

ST3: ST3-1, ST3-2
ST4: ST4-1, ST4-2

ST1: SE1, ACT1, GE1, DE1
ACTL: DE1, ACT1, SE1
GTL1: GE1, CPE1
GTL2: CPE2
SDL1: VCE
SDL2: DL, VDDL

ACTL : DE3-1, ACT3-1, SE3-1
        DE3-2, ACT3-2, SE3-2
GTL1 : GE3-1, GE3-2
GTL2 : CPE

ST3: ST3-1, ST3-2
ST4: ST4-1, ST4-2

ST3: ST3-1, ST3-2
ST4: ST4-1, ST4-2

DISPLAY DEVICE

This application claims priority from Korean Patent Application No. 10-2023-0130962, filed on Sep. 27, 2023, the content of which in its entirety is herein incorporated by reference.

BACKGROUND

1. Field of the Disclosure

The present invention relates to a display device.

2. Description of the Related Art

As the information-oriented society evolves, various demands for display devices are ever increasing. For example, display devices are being employed by a variety of electronic devices such as smart phones, digital cameras, laptop computers, navigation devices, and smart televisions. A display device, in which each of the pixels of the display panel includes a light-emitting element that can emit light by itself, can display images without a backlight unit that supplies light to the display panel.

The display device includes a plurality of pixels, data lines and gate lines connected to the plurality of pixels, a data driver that supplies data voltages to the data lines, and a gate driver that supplies gate signals to the gate lines. The data driver and the gate driver may drive the plurality of pixels at a predetermined frequency.

SUMMARY

Aspects of the invention provide a display device that can reduce leakage current flowing through a third-first transistor and a third-second transistor connected in series between a gate electrode and a drain electrode of a first transistor and can stably maintain a voltage inside a pixel.

According to an embodiment, a display device includes a light-emitting element disposed on a substrate, a first transistor for controlling a driving current flowing in the light-emitting element, a second transistor for applying a data voltage to a source electrode of the first transistor, a third-first transistor connected to a gate electrode of the first transistor, and a third-second transistor connected between a source electrode of the third-first transistor and a drain electrode of the first transistor. One side of a semiconductor region of the third-second transistor disposed adjacent to a source electrode of the third-second transistor has a first width, and another side of the semiconductor region of the third-second transistor disposed adjacent to a drain electrode of the third-second transistor has a second width that is smaller than the first width.

In an embodiment, one side of a gate electrode of the third-second transistor disposed adjacent to the source electrode of the third-second transistor may have the first width, and another side of the gate electrode of the third-second transistor disposed adjacent to the drain electrode of the third-second transistor may have the second width.

In an embodiment, one side of a semiconductor region of the third-first transistor disposed adjacent to the source electrode of the third-first transistor may have a third width, and another side of the semiconductor region of the third-first transistor disposed adjacent to a drain electrode of the third-first transistor may have a fourth width that is greater than the third width.

In an embodiment, one side of a gate electrode of the third-first transistor disposed adjacent to the source electrode of the third-first transistor may have the third width, and another side of the gate electrode of the third-first transistor disposed adjacent to the drain electrode of the third-first transistor may have the fourth width.

In an embodiment, the display device may further include a driving voltage line supplying a driving voltage, a first capacitor connected between the gate electrode of the first transistor and the driving voltage line, and a second capacitor connected between the source electrode of the third-first transistor and the driving voltage line.

In an embodiment, a first capacitor electrode of the second capacitor may be formed as one body with the source electrode of the third-first transistor and the drain electrode of the third-second transistor, and the second capacitor electrode of the second capacitor may be disposed on the first capacitor electrode and electrically connected to the driving voltage line.

In an embodiment, the display device may further include a first initialization voltage line supplying a first initialization voltage, a second initialization voltage line supplying a second initialization voltage, a fourth-first transistor connected to the gate electrode of the first transistor, a fourth-second transistor connected between a drain electrode of the fourth-first transistor and the first initialization voltage line, a fifth transistor connected between the driving voltage line and the source electrode of the first transistor, a sixth transistor connected between the drain electrode of the first transistor and a first electrode of the light-emitting element, and a seventh transistor connected between the first electrode of the light-emitting element and the second initialization voltage line.

In an embodiment, the display device may further include a bias voltage line supplying a bias voltage, and an eighth transistor connected between the bias voltage line and the source electrode of the first transistor.

In an embodiment, the display device may further include a first gate line supplying a first gate signal to a gate electrode of the second transistor, a second gate line supplying a second gate signal to a gate electrode of the third-first transistor and a gate electrode of the third-second transistor, which are formed as one body, a third gate line supplying a third gate signal to a gate electrode of the fourth-first transistor and a gate electrode of the fourth-second transistor, which are integrally formed, an emission control line supplying an emission signal to a gate electrode of the fifth transistor and the gate electrode of the sixth transistor, and a fourth gate line supplying a fourth gate signal to a gate electrode of the seventh transistor.

According to an embodiment, a fingerprint sensor includes a light-emitting element disposed on a substrate, a first transistor for controlling a driving current flowing in the light-emitting element, a second transistor for applying a data voltage to a source electrode of the first transistor, a third-first transistor connected to a gate electrode of the first transistor, and a third-second transistor connected between a source electrode of the third-first transistor and a drain electrode of the first transistor. One side of a semiconductor region of the third-second transistor disposed adjacent to a source electrode of the third-second transistor has a first width, and another side of the semiconductor region of the third-second transistor disposed adjacent to a drain electrode of the third-second transistor has a second width that is smaller than the first width. One side of a semiconductor region of the third-first transistor disposed adjacent to a source electrode of the third-first transistor has a third width, and another side of the semiconductor region of the third-first transistor disposed adjacent to a drain electrode of the third-first transistor has a fourth width equal to the third width.

In an embodiment, one side of agate electrode of the third-second transistor disposed adjacent to the source electrode of the third-second transistor may have the first width, and another side of the gate electrode of the third-second transistor disposed adjacent to the drain electrode of the third-second transistor may have the second width.

In an embodiment, one side of a gate electrode of the third-first transistor disposed adjacent to the source electrode of the third-first transistor may have the third width, and another side of the gate electrode of the third-first transistor disposed adjacent to the drain electrode of the third-first transistor may have the fourth width.

In an embodiment, the display device may further include a driving voltage line supplying a driving voltage, a first capacitor connected between the gate electrode of the first transistor and the driving voltage line, and a second capacitor connected between the source electrode of the third-first transistor and the driving voltage line.

In an embodiment, a first capacitor electrode of the second capacitor may be formed as one body with the source electrode of the third-first transistor and the drain electrode of the third-second transistor, and the second capacitor electrode of the second capacitor may be disposed on the first capacitor electrode and electrically connected to the driving voltage line.

In an embodiment, the display device may further include a first initialization voltage line supplying a first initialization voltage, a second initialization voltage line supplying a second initialization voltage, a fourth-first transistor connected to the gate electrode of the first transistor, a fourth-second transistor connected between a drain electrode of the fourth-first transistor and the first initialization voltage line, a fifth transistor connected between the driving voltage line and the source electrode of the first transistor, a sixth transistor connected between the drain electrode of the first transistor and a first electrode of the light-emitting element, and a seventh transistor connected between the first electrode of the light-emitting element and the second initialization voltage line.

In an embodiment, the display device may further include a bias voltage line supplying a bias voltage, and an eighth transistor connected between the bias voltage line and the source electrode of the first transistor.

In an embodiment, the semiconductor region of the third-second transistor may have a trapezoidal shape.

In an embodiment, the semiconductor region of the third-second transistor may include a first side extended in a first direction and having a first length, a second side extended in a direction parallel to the first side and having a second length that is smaller than the first length, a third side extended in a second direction perpendicular to the first direction between one end of the first side and one end of the second side, and a fourth side extended in a diagonal direction between the first direction and the second direction from an opposite end of the first side to an opposite end of the second side.

In an embodiment, a gate electrode of the third-second transistor may have a trapezoidal shape.

In an embodiment, the gate electrode of the third-second transistor may include a first side extended in a first direction and having a first length, a second side extended in a direction parallel to the first side and having a second length smaller than the first length, a third side extended in a second direction perpendicular to the first direction between one end of the first side and one end of the second side, and a fourth side extended in a diagonal direction between the first direction and the second direction from an opposite end of the first side to an opposite end of the second side.

According to an embodiment, one side of a semiconductor region disposed adjacent to a source electrode of a third-second transistor may have a first width, the other side of the semiconductor region disposed adjacent to a drain electrode of a third-second transistor may have a second width that is smaller than the first width, so that leakage current flowing through the third-first transistor and the third-second transistor can be reduced, and the voltage inside the pixel can be stably maintained.

It should be noted that effects of the invention are not limited to those described above and other effects of the invention will be apparent to those skilled in the art.

BRIEF DESCRIPTION OF THE DRAWINGS

The above and other aspects and features of the invention will become more apparent by describing in detail exemplary embodiments thereof with reference to the attached drawings, in which.

DETAILED DESCRIPTION

Figure 1:
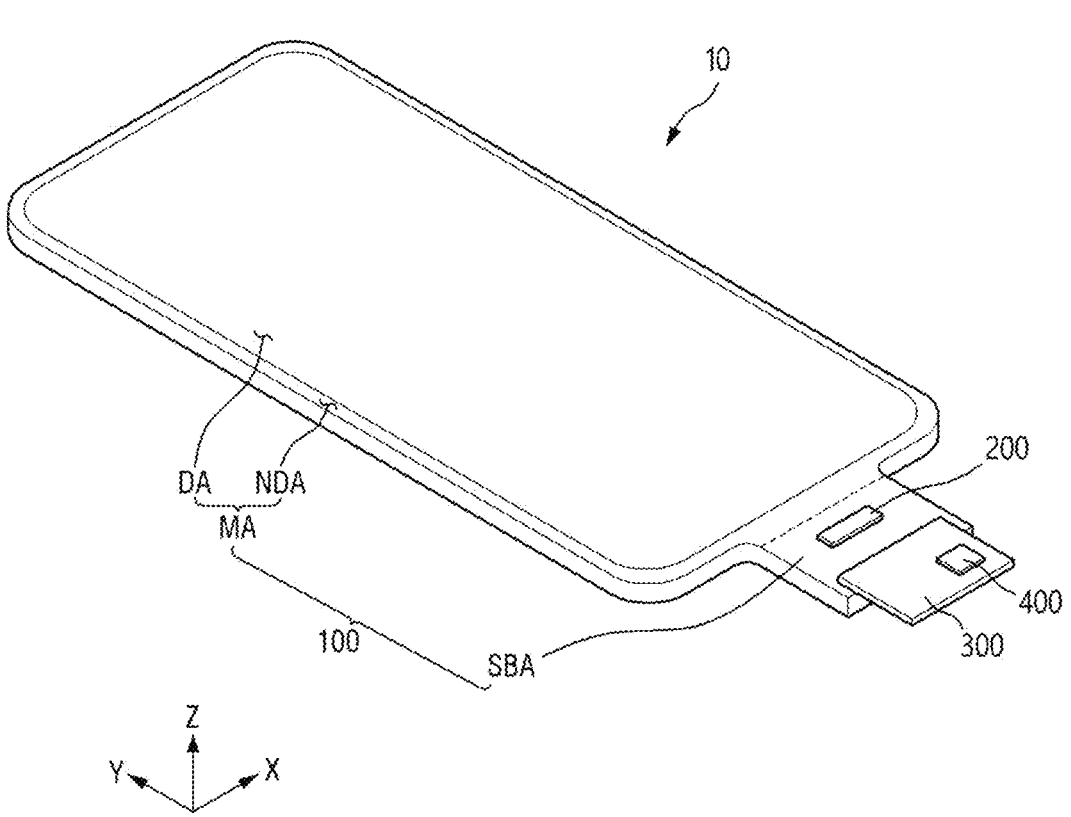
FIG. 1 is a perspective view showing a display device, according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of the invention disclosed herein. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive nor limit the disclosure. For example, specific shapes, configurations, and characteristics of an embodiment may be used or implemented in other embodiments without departing from the scope of the invention.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the scope of the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, ZZ, or the like. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and, as such, are not intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the invention.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, detailed embodiments of the invention are described with reference to the accompanying drawings.

FIG. 1 is a perspective view of a display device, according to an embodiment.

In an embodiment and referring to FIG. 1, a display device 10 may be employed by portable electronic devices such as a mobile phone, a smart phone, a tablet PC, a mobile communications terminal, an electronic notebook, an electronic book, a portable multimedia player (PMP), a navigation device and an ultra mobile PC (UMPC). For example, the display device 10 may be used as a display unit of a television, a laptop computer, a monitor, an electronic billboard, or the Internet of Things (IOT). For another example, the display device 10 may be applied to wearable devices such as a smart watch, a watch phone, a glasses-type display, and a head-mounted display (HMD) device.

In an embodiment, the display device 10 may have a shape similar to a quadrangular shape when viewed from the top. For example, the display device 10 may have a shape similar to a quadrangle having shorter sides in the x-axis direction and longer sides in the y-axis direction when viewed from the top. The corners where the shorter sides in the x-axis direction and the longer sides in the y-axis direction meet may be rounded to have a predetermined curvature or may be formed at a right angle. The shape of the display device 10 when viewed from the top is not limited to a quadrangular shape, but may be formed in a shape similar to other polygonal shapes, a circular shape, or an elliptical shape.

In an embodiment, the display device 10 may include a display panel 100, a display driver 200, a circuit board 300 and a touch driver 400.

In an embodiment, the display panel 100 may include a main area MA and a subsidiary area SBA.

In an embodiment, the main area MA may include a display area DA having pixels for displaying images, and a non-display area NDA located around the display area DA. The display area DA may output lights from a plurality of emission areas or a plurality of open areas. For example, the display panel 100 may include a pixel circuit including switching elements, a pixel-defining layer that defines the emission areas or the opening areas, and a self-light-emitting element.

In an embodiment, the self-light-emitting element may include, but is not limited to, one of an organic light-emitting diode including an organic emissive layer, a quantum-dot light-emitting diode (quantum LED) including a quantum-dot emissive layer, an inorganic light-emitting diode (inorganic LED) including an inorganic semiconductor, and a micro light-emitting diode (micro LED).

In an embodiment, the non-display area NDA may be disposed on the outer side of the display area DA. The non-display area NDA may be defined as the edge area of the main area MA of the display panel 100. The non-display area NDA may include a gate driver (not shown) that applies gate signals to gate lines, and fan-out lines (not shown) that connect the display driver 200 with the display area DA.

In an embodiment, the subsidiary area SBA may be extended from one side of the main area MA. The subsidiary area SBA may include a flexible material that can be bent, folded, or rolled. For example, when the subsidiary area SBA is bent, the subsidiary area SBA may overlap the main area MA in the thickness direction (z-axis direction). The subsidiary area SBA may include pads connected to the display driver 200 and the circuit board 300. Optionally, the subsidiary area SBA may be eliminated, and the display driver 200 and the pads may be disposed in the non-display area NDA.

In an embodiment, the display driver 200 may output signals and voltages for driving the display panel 100. The display driver 200 may supply data voltages to data lines. The display driver 200 may apply a supply voltage to a voltage line and may supply gate control signals to the gate driver. The display driver 200 may be implemented as an integrated circuit (IC) and may be attached on the display panel 100 by a chip-on-glass (COG) technique, a chip-on-plastic (COP) technique, or ultrasonic bonding. For example, the display driver 200 may be disposed in the subsidiary area SBA and may overlap with the main area MA in the thickness direction (z-axis direction) as the subsidiary area SBA is bent. For another example, the display driver 200 may be mounted on the circuit board 300.

In an embodiment, the circuit board 300 may be attached on the pad area of the display panel 100 using an anisotropic conductive film (ACF). Lead lines of the circuit board 300 may be electrically connected to the pads of the display panel 300. The circuit board 300 may be a flexible printed circuit board (FPCB), a printed circuit board (PCB), or a flexible film such as a chip-on-film (COF).

In an embodiment, the touch driver 400 may be mounted on the circuit board 300. The touch driver 400 may be electrically connected to a touch sensing unit of the display panel 100. The touch driver 400 may supply a touch driving signal to a plurality of touch electrodes of the touch sensing unit and may sense a change in the capacitance between the plurality of touch electrodes. For example, the touch driving signal may be a pulse signal having a predetermined frequency. The touch driver 400 may determine whether there is an input and may find the coordinates of the input based on the amount of the change in the capacitance between the touch electrodes. The touch driver 400 may be implemented as an integrated circuit (IC).

Figure 2:
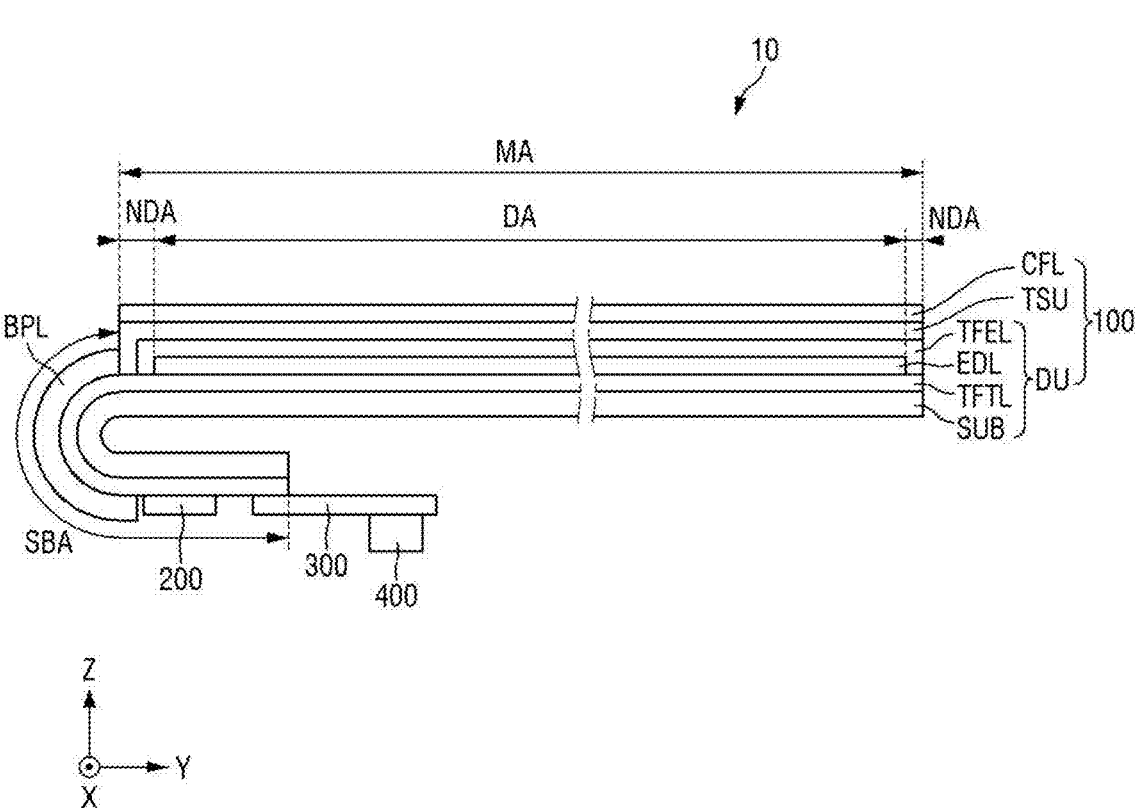
FIG. 2 is a cross-sectional view showing a display device, according to an embodiment.

FIG. 2 is a cross-sectional view showing a display device, according to an embodiment.

In an embodiment and referring to FIG. 2, the display panel 100 may include a display unit DU, a touch sensing unit TSU, and a color filter layer CFL. The display unit DU may include a substrate SUB, a transistor layer TFTL, an emission material layer EDL and an encapsulation layer TFEL.

In an embodiment, the substrate SUB may be a base substrate or a base member. The substrate SUB may be a flexible substrate that can be bent, folded, or rolled. For example, the substrate SUB may include, but is not limited to, a polymer resin such as polyimide PI. For another example, the substrate SUB may include a glass material or a metal material.

In an embodiment, the transistor layer TFTL may be disposed on the substrate SUB. The transistor layer TFTL may include a plurality of thin-film transistors forming pixel circuits of pixels. The transistor layer TFTL may include gate lines, data lines, voltage lines, gate control lines, fan-out lines for connecting the display driver 200 with the data lines, lead lines for connecting the display driver 200 with the pads, etc. Each of the thin-film transistors may include a semiconductor region, a source electrode, a drain electrode, and a gate electrode. For example, when the gate driver is formed on one side of the non-display area NDA of the display panel 100, the gate driver may include thin-film transistors.

In an embodiment, the transistor layer TFTL may be disposed in the display area DA, the non-display area NDA and the subsidiary area SBA. The thin-film transistors in each of the pixels, the gate lines, the data lines and the voltage lines in the transistor layer TFTL may be disposed in the display area DA. The gate control lines and the fan-out lines in the transistor layer TFTL may be disposed in the non-display area NDA. The lead lines of the transistor layer TFTL may be disposed in the subsidiary area SBA.

In an embodiment, the emission material layer EDL may be disposed on the transistor layer TFTL. The emission material layer EDL may include a plurality of light-emitting elements in each of which a pixel electrode, an emissive layer and a common electrode are stacked on one another sequentially to emit light, and a pixel-defining film for defining the pixels. The plurality of light-emitting elements in the emission material layer EDL may be disposed in the display area DA.

In an embodiment, the emissive layer may be an organic light-emitting layer containing an organic material. The emissive layer may include a hole transporting layer, an organic light-emitting layer and an electron transporting layer. When the pixel electrode receives a voltage and the common electrode receives a cathode voltage through the thin-film transistors in the thin-film transistor layer TFTL, holes may move to the organic light-emitting layer through the hole transporting layer and electrons may move to the organic light-emitting layer through the electron transporting layer, such that the holes and the electrons combine in the organic light-emitting layer to emit light. For example, the pixel electrode may be an anode electrode while the common electrode may be a cathode electrode. It is, however, to be understood that the invention is not limited thereto.

In another embodiment, the light-emitting elements may include quantum-dot light-emitting diodes each including a quantum-dot emissive layer, inorganic light-emitting diodes each including an inorganic semiconductor, or micro light-emitting diodes.

In an embodiment, the encapsulation layer TFEL may cover the upper and side surfaces of the emission material layer EDL, and can protect the emission material layer EDL. The encapsulation layer TFEL may include at least one inorganic layer and at least one organic layer for encapsulating the emission material layer EDL.

In an embodiment, the touch sensing unit TSU may be disposed on the encapsulation layer TFEL. The touch sensing unit TSU may include a plurality of touch electrodes for sensing a user's touch by capacitive sensing, and touch lines connecting the touch electrodes with the touch driver 400. For example, the touch sensing unit TSU may sense a user's touch by mutual capacitance sensing or self-capacitance sensing.

In another embodiment, the touch sensing unit TSU may be disposed on a separate substrate disposed on the display unit DU. In such case, the substrate supporting the touch sensing unit TSU may be an encapsulation substrate that encapsulates the display unit DU.

In an embodiment, the plurality of touch electrodes of the touch sensing unit TSU may be disposed in a touch sensor area overlapping with the display area DA. The touch lines of the touch sensing unit TSU may be disposed in a touch peripheral area overlapping with the non-display area NDA.

In an embodiment, the color filter layer CFL may be disposed on the touch sensing unit TSU. The color filter layer CFL may include a plurality of color filters associated with the plurality of emission areas, respectively. Each of the color filters may selectively transmit light of a particular wavelength and block or absorb light of other wavelengths. The color filter layer CFL may absorb some of light introduced from the outside of the display device 10 to reduce the reflection of external light. Accordingly, the color filter layer CFL can prevent distortion of colors due to the reflection of external light.

In an embodiment, since the color filter layer CFL is disposed directly on the touch sensing unit TSU, the display device 10 may require no separate substrate for the color filter layer CFL. Therefore, the thickness of the display device 10 can be relatively reduced.

In an embodiment, the subsidiary area SBA of the display panel 100 may be extended from one side of the main area MA. The subsidiary area SUB may include a flexible material that can be bent, folded, or rolled. For example, when the subsidiary area SBA is bent, the subsidiary area SBA may overlap the main area MA in the thickness direction (z-axis direction). The subsidiary area SBA may include pads electrically connected to the display driver 200 and the circuit board 300.

In an embodiment, the display device 10 may include a bending protection layer BPL that protects the subsidiary area SBA. The bending protection layer BPL may be disposed on the transistor layer TFTL of the bent subsidiary area SBA. The bending protection layer BPL may protect the transistor layer TFTL of the bent subsidiary area SBA and reduce tensile stress of the subsidiary area SBA.

Figure 3:
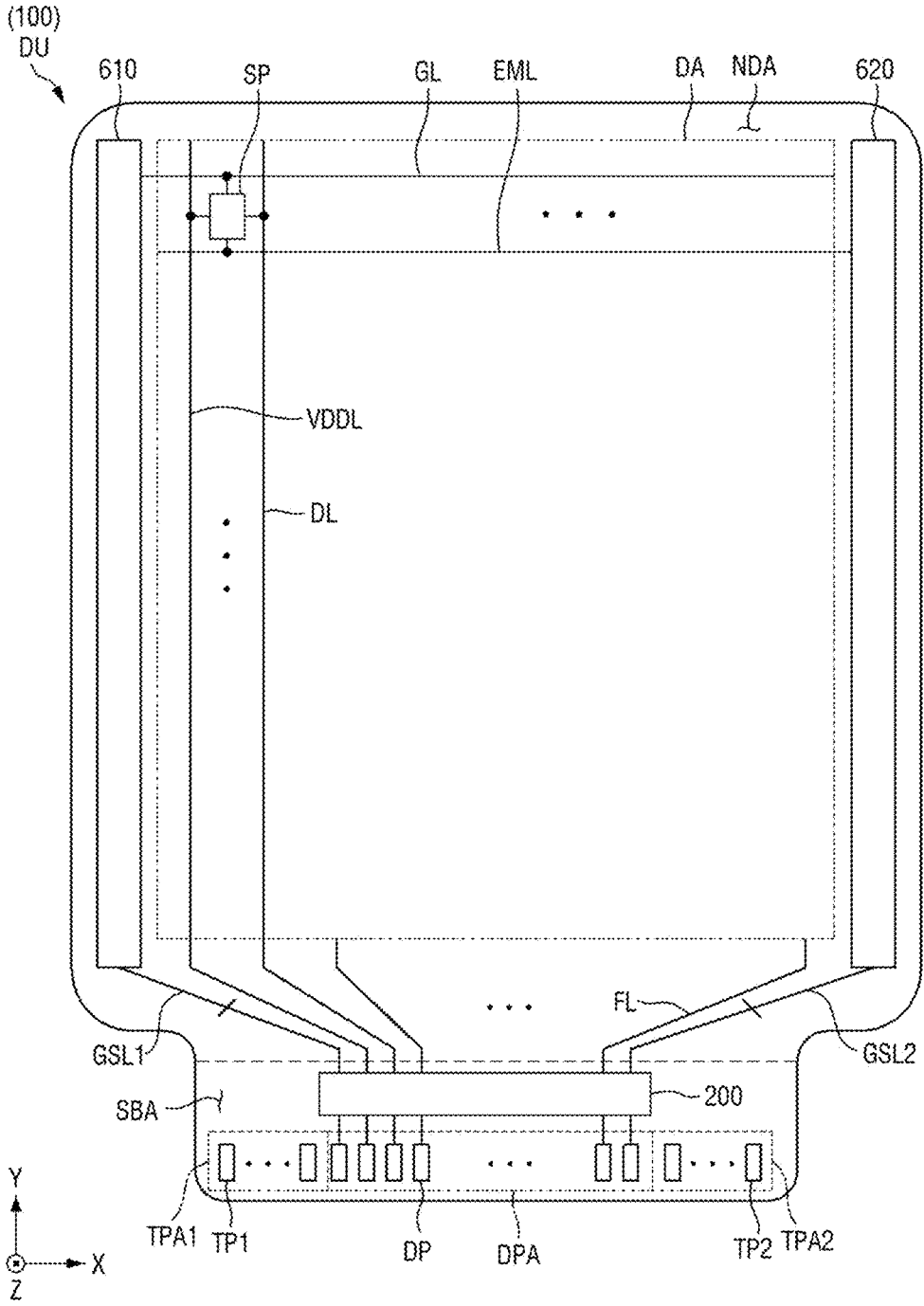
FIG. 3 is a plan view showing a display unit of a display device, according to an embodiment.
Figure 4:
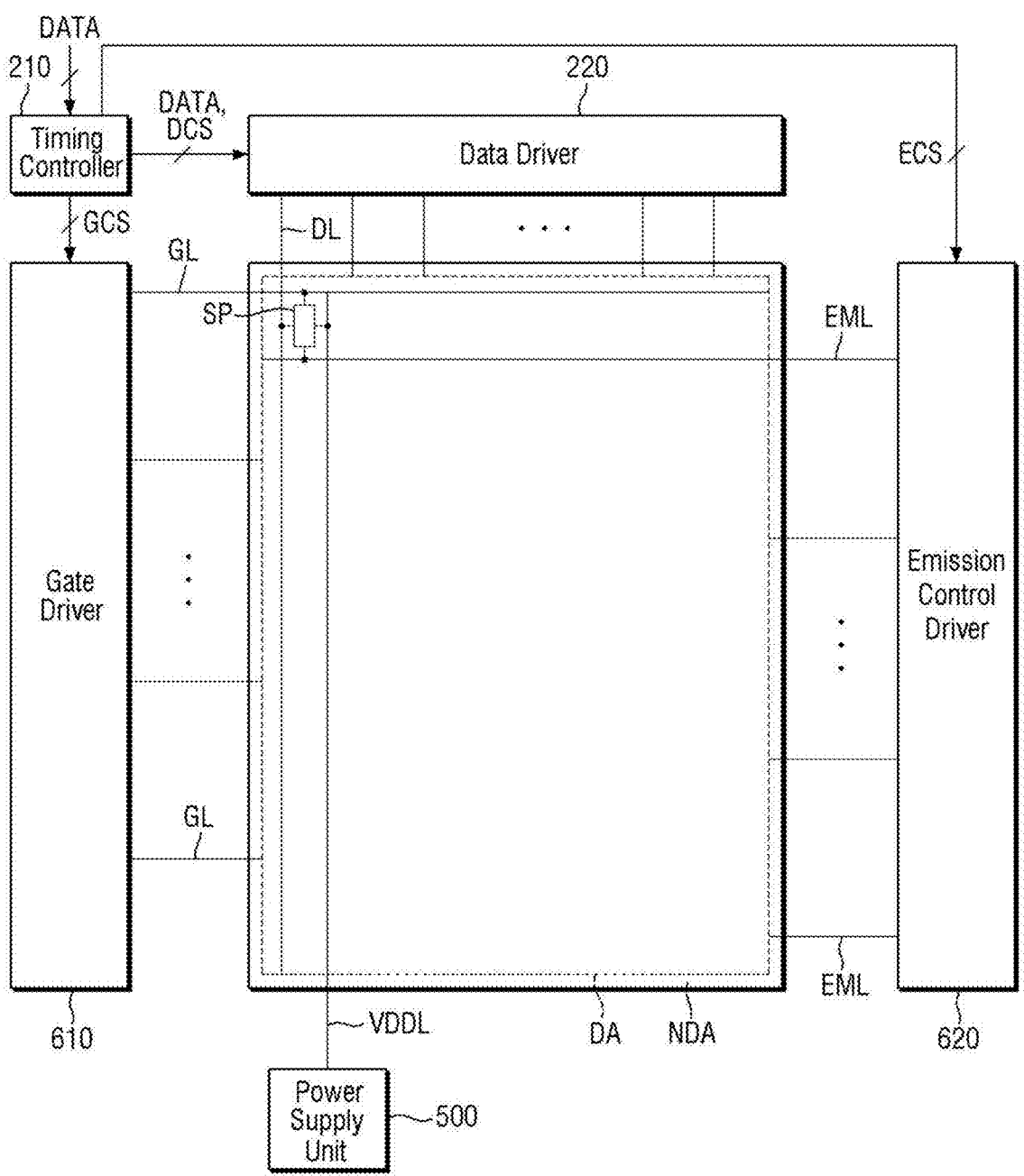
FIG. 4 is a block diagram illustrating the display panel and the display driver, according to an embodiment.

FIG. 3 is a plan view showing the display unit of the display device, according to an embodiment. FIG. 4 is a block diagram illustrating the display panel and the display driver, according to an embodiment.

In an embodiment and referring to FIGS. 3 and 4, the display panel 100 may include the display area DA and the non-display area NDA. The display area DA may include pixels SP, driving voltage lines VDDL, gate lines GL, emission control lines EML, and data lines DL.

In an embodiment, each of the plurality of pixels SP may be connected to a gate line GL, a data line DL, an emission control line EML, and a driving voltage line VDDL. Each of the plurality of pixels SP may include at least one transistor, a light-emitting element, and a capacitor.

In an embodiment, the gate lines GL may be extended in the x-axis direction and may be spaced apart from one another in the y-axis direction crossing the x-axis direction. The gate lines GL may sequentially supply gate signals to the plurality of pixels SP.

In an embodiment, the emission control lines EML may be extended in the x-axis direction and may be spaced apart from each other in the y-axis direction. The emission control lines EML may sequentially supply emission signals to the pixels SP.

In an embodiment, the data lines DL may be extended in the y-axis direction and may be spaced apart from one another in the x-axis direction. The data lines DL may supply data voltages to the pixels SP. The data voltage may determine the luminance of each of the plurality of pixels SP.

In an embodiment, the driving voltage lines VDDL may be extended in the y-axis direction and may be spaced apart from one another in the x-axis direction. The driving voltage lines VDDL may supply driving voltages to the pixels SP. The driving voltages may be high-level voltages for driving the light-emitting elements of the pixels SP.

In an embodiment, the non-display area NDA may surround the display area DA. The non-display area NDA may include a gate driver 610, an emission control driver 620, fan-out lines FL, a first gate control line GSL1 and a second gate control line GSL2.

In an embodiment, the fan-out lines FL may extend from the display driver 200 to the display area DA. The fan-out lines FL may supply the data voltage received from the display driver 200 to the data lines DL. The fan-out lines FL may supply the driving voltages received from the display driver 200 to the driving voltage lines VDDL.

In an embodiment, the first gate control line GSL1 may extend from the display driver 200 to the gate driver 610. The first gate control line GSL1 may supply the gate control signal GCS received from the display driver 200 to the gate driver 610.

In an embodiment, the second gate control line GSL2 may extend from the display driver 200 to the emission control driver 620. The second gate control line GSL2 may supply the emission control signal ECS received from the display driver 200 to the emission control driver 620.

In an embodiment, the subsidiary area SBA may be extended from one side of the non-display area NDA. The subsidiary area SBA may include the display driver 200 and pads DP. The pads DP may be disposed closer to one edge of the subsidiary area SBA than the display driver 200. The pads DP may be electrically connected to the circuit board 300 through an anisotropic conductive film ACF.

In an embodiment, the display driver 200 may include a timing controller 210 and a data driver 220.

In an embodiment, the timing controller 210 may receive digital video data DATA and timing signals from the circuit board 300. The timing controller 210 may generate a data control signal DCS to control the operation timing of the data driver 220, may generate a gate control signal GCS to control the operation timing of the gate driver 610, and may generate an emission control signal ECS to control the operation timing of the emission control driver 620 based on the timing signals. The timing controller 210 may supply the gate control signal GCS to the gate driver 610 through the first gate control line GSL1. The timing controller 210 may supply the emission control signal ECS to the emission control driver 620 through the second gate control line GSL2. The timing controller 210 may supply the digital video data DATA and the data control signal DCS to the data driver 220.

In an embodiment, the data driver 220 may convert the digital video data DATA into analog data voltages and may supply them to the data lines DL through the fan-out lines FL. The gate signals of the gate driver 610 may be used to select pixels SP to which data voltages are applied, and the selected pixels SP may receive the data voltages through the data lines DL.

In an embodiment, a power supply unit 500 may apply supply voltages to the display driver 200 and the display panel 100. The power supply unit 500 may generate a driving voltage to supply it to the driving voltage line VDDL, and may generate a common voltage to supply it to a common electrode shared by the light-emitting elements of a plurality of pixels SP. The power supply unit 500 may generate an initialization voltage to supply it to the initialization voltage line, may generate a reference voltage to supply it to a reference voltage line, and may generate a bias voltage to supply it to a bias voltage line.

In an embodiment, the gate driver 610 may be disposed on one outer side of the display area DA or on one outer side of the non-display area NDA, and the emission control driver 620 may be disposed on the opposite outer side of the display area DA or on the opposite outer side of the non-display area NDA. It should be understood, however, that the invention is not limited thereto. In another embodiment, the gate driver 610 and the emission control driver 620 may be disposed on one side or the opposite side of the non-display area NDA.

In an embodiment, the gate driver 610 may include a plurality of thin-film transistors for generating gate signals based on the gate control signal GCS. The emission control driver 620 may include a plurality of thin-film transistors for generating emission signals based on the emission control signal ECS. For example, the transistors of the gate driver 610 and the transistors of the emission control driver 620 may be formed in the same layer as the transistors of each of the pixels SP. The gate driver 610 may provide gate signals to the gate lines GL, and the emission control driver 620 may provide emission signals to the emission control lines EML.

Figure 5:
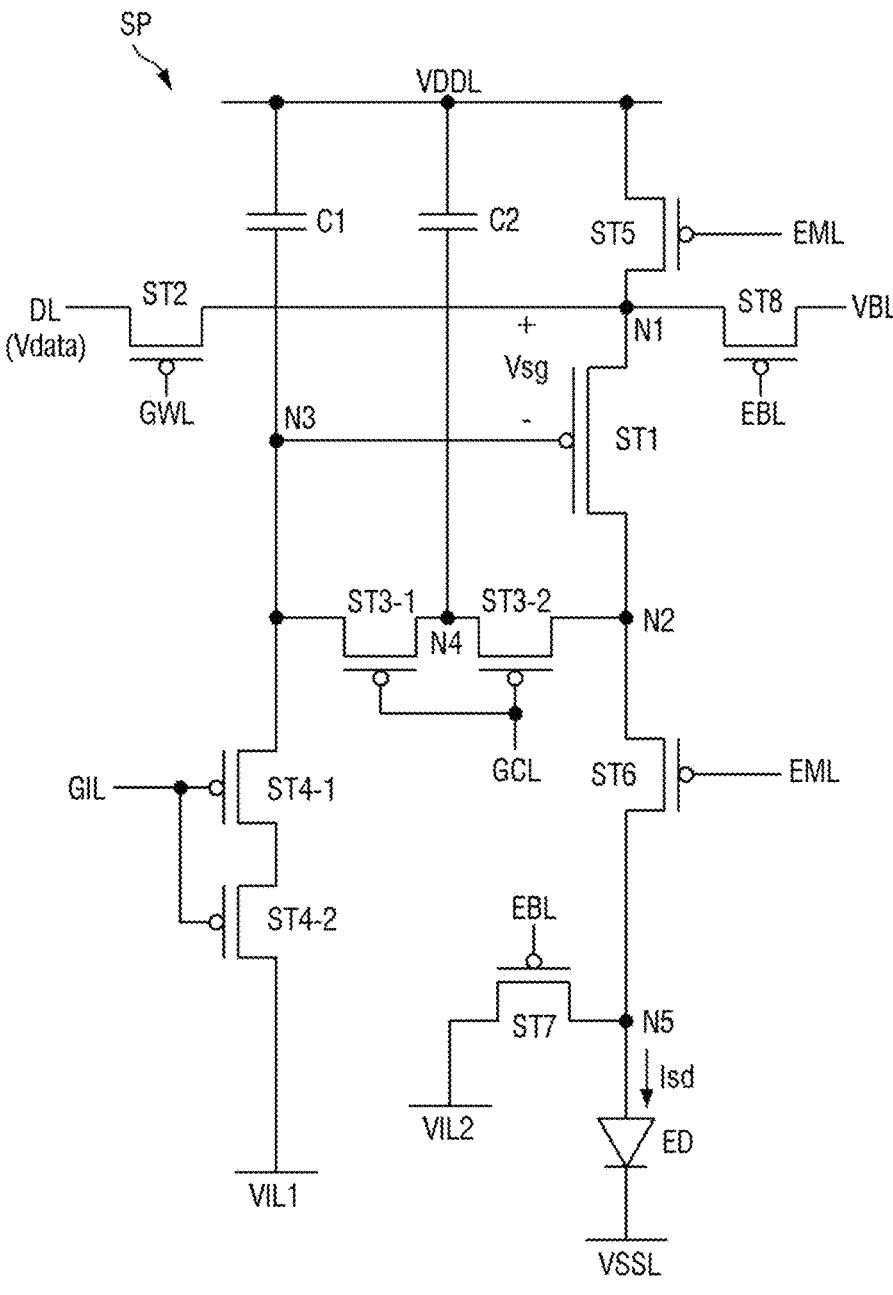
FIG. 5 is a circuit diagram showing a pixel of a display device, according to an embodiment.
Figure 6:
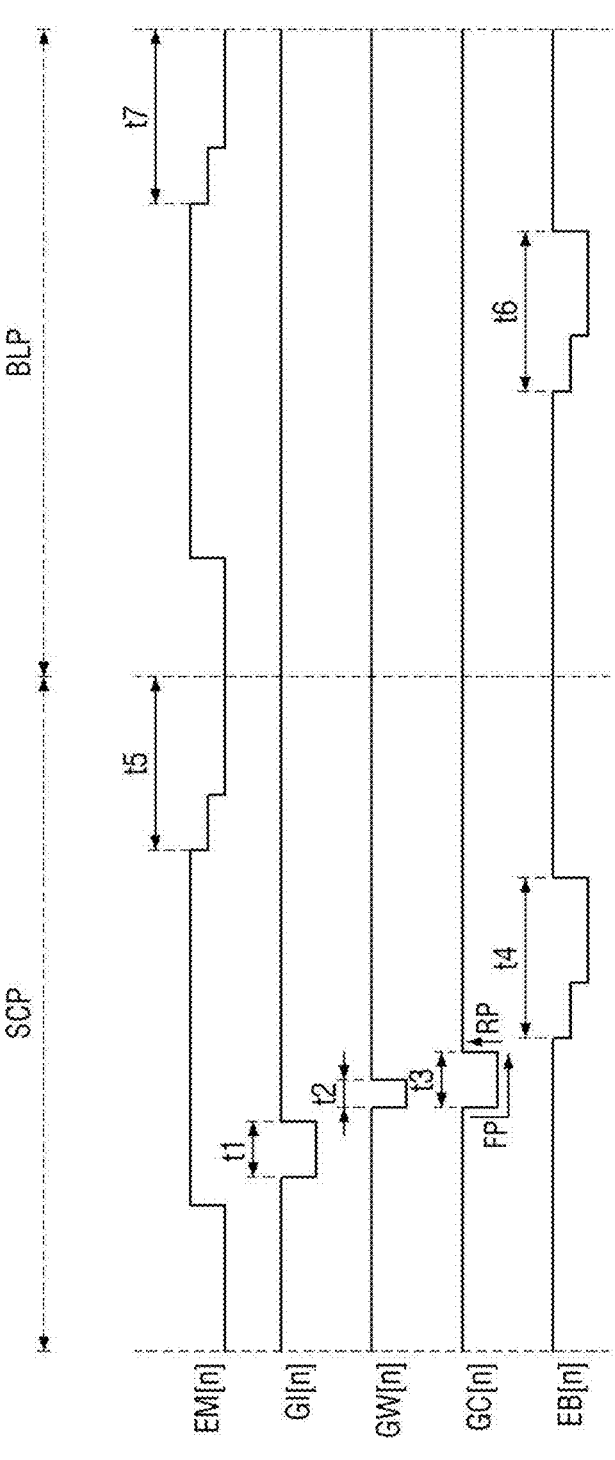
FIG. 6 is a waveform diagram of signals supplied to the pixel shown in FIG. 5, according to an embodiment.

FIG. 5 is a circuit diagram showing a pixel of a display device, according to an embodiment. FIG. 6 is a waveform diagram of signals supplied to the pixel shown in FIG. 5, according to an embodiment.

In an embodiment and referring to FIGS. 5 and 6, the display panel 100 may include a plurality of pixels SP arranged in rows and columns. Each of the plurality of pixels SP may be connected to a first gate line GWL, a second gate line GCL, a third gate line GIL, a fourth gate line EBL, an emission control line EML, a data line DL, a driving voltage line VDDL, a first initialization voltage line VIL1, a second initialization voltage line VIL2, a bias voltage line VBL, and a low potential line VSSL.

In an embodiment, the pixel SP may include a pixel circuit and a light-emitting element ED. The pixel circuit may include first to eighth transistors ST1, ST2, ST3, ST4, ST5, ST6, ST7 and ST8, respectively, and first and second capacitors C1, C2, respectively.

In an embodiment, the first transistor ST1 may include a gate electrode, a source electrode, and a drain electrode. The first transistor ST1 may control the source-drain current Isd (hereinafter, referred to as "driving current") according to the data voltage applied to the gate electrode. The driving current Isd flowing through the channel of the first transistor ST1 may be proportional to the square of the difference between the threshold voltage Vth and the voltage Vsg between the source electrode and the gate electrode of the first transistor ST1 (Isd=k'×(Vsg−Vth)$^2$), where k denotes a proportional coefficient determined by the structure and physical properties of the first transistor ST1, Vsg denotes the source-gate voltage of the first transistor ST1, and Vth denotes the threshold voltage of the first transistor ST1.

In an embodiment, the light-emitting element ED may receive the driving current to emit light. The amount or the luminance of the light emitted from the light-emitting element ED may be proportional to the magnitude of the driving current Isd.

In an embodiment, the light-emitting element ED may be an organic light-emitting diode including a first electrode, a second electrode, and an organic light-emitting layer disposed between the first electrode and the second electrode. Herein, the first electrode of the light-emitting element ED may be a pixel electrode, and the second electrode thereof may be a common electrode. In another embodiment, the light-emitting element ED may be an inorganic light-emitting element including a first electrode, a second electrode, and an inorganic semiconductor disposed between the first electrode and the second electrode. In another embodiment, the light-emitting element ED may be a quantum-dot light-emitting element including a first electrode, a second electrode, and a quantum-dot emissive layer between the first electrode and the second electrode. In another embodiment, the light-emitting element ED may be a micro light-emitting diode.

In an embodiment, the first electrode of the light-emitting element ED may be electrically connected to a fifth node N5. The first electrode of the light-emitting element ED may be connected to the drain electrode of the sixth transistor ST6 and the source electrode of the seventh transistor ST7 through the fifth node N5. The second electrode of the light-emitting element ED may be connected to a low potential line VSSL. The second electrode of the light-emitting element ED may receive a low-level voltage from the low potential line VSSL.

In an embodiment, the second transistor ST2 may be turned on by a first gate signal GW[n] of the first gate line GWL to electrically connect the data line DL with the first node N1, which is the source electrode of the first transistor ST1. The second transistor ST2 may be turned on in response to the first gate signal GW[n] to apply data voltage to the first node N1. The gate electrode of the second transistor ST2 may be connected to the first gate line GWL, the source electrode thereof may be connected to the data line DL, and the drain electrode thereof may be connected to the first node N1.

In an embodiment, the third transistor ST3 may be turned on by a second gate signal GC[n] of the second gate line GCL and may electrically connect a second node N2 which is the drain electrode of the first transistor ST1 with a third node N3 which is the gate electrode of the first transistor ST1. The third transistor ST3 may include a third-first transistor ST3-1 and a third-second transistor ST3-2. The third-first transistor ST3-1 and the third-second transistor ST3-2 may be connected in series between the third node N3 and the second node N2. The gate electrode of the third-first transistor ST3-1 and the gate electrode of the third-second transistor ST3-2 may be formed as one body and connected to the second gate line GCL. The source electrode of the third-first transistor ST3-1 and the drain electrode of the third-second transistor ST3-2 may be formed as one body and may correspond to a fourth node N4. The drain electrode of the third-first transistor ST3-1 may be connected to the third node N3, and the source electrode of the third-second transistor ST3-2 may be connected to the second node N2.

In an embodiment, the third-first transistor ST3-1 and the third-second transistor ST3-2 can have excellent leakage current or off-current characteristics. Accordingly, the third-first transistor ST3-1 and the third-second transistor ST3-2 can prevent leakage current and can maintain the voltage inside the pixel SP stably. The leakage current characteristics of the third-first transistor ST3-1 and the third-second transistor ST3-2 are described in detail with reference to FIGS. 10 to 13.

In an embodiment, a fourth transistor ST4 may be turned on by a third gate signal GI[n] of the third gate line GIL to electrically connect the third node N3 which is the gate electrode of the first transistor ST1 with the first initialization voltage line VIL1. The fourth transistor ST4 may be turned on based on the third gate signal GI[n], thereby discharging the third node N3 to a first initialization voltage. The fourth transistor ST4 may include a fourth-first transistor ST4-1 and a fourth-second transistor ST4-2. The fourth-first transistor ST4-1 and the fourth-second transistor ST4-2 may be connected in series between the third node N3 and the first initialization voltage line VIL1. The gate electrode of the fourth-first transistor ST4-1 and the gate electrode of the fourth-second transistor ST4-2 may be formed as one body and connected to the third gate line GIL. The source electrode of the fourth-first transistor ST4-1 may be connected to the third node N3, and the drain electrode of the fourth-second transistor ST4-2 may be connected to the first initialization voltage line VIL1. The drain electrode of the fourth-first transistor ST4-1 and the source electrode of the fourth-second transistor ST4-2 may be formed as one body.

In an embodiment, the 4-1 transistor ST4-1 and the 4-2 transistor ST4-2 can have excellent leakage current or off-current characteristics. Accordingly, the fourth-first transistor ST4-1 and the fourth-second transistor ST4-2 can prevent leakage current at the third node N3 that is the gate electrode of the first transistor ST1 and can maintain the voltage inside the pixel SP stably.

In an embodiment, the fifth transistor ST5 may be turned on by an emission signal EM[n] of the emission control line EML and may electrically connect the driving voltage line VDDL with the first node N1 which is the source electrode of the first transistor ST1. The gate electrode of the fifth transistor ST5 may be connected to the emission control line EML, the source electrode thereof may be connected to the driving voltage line VDDL, and the drain electrode thereof may be connected to the first node N1.

In an embodiment, the sixth transistor T6 may be turned on by the emission signal EM[n] of the emission control line EML to electrically connect the second node N2 which is the drain electrode of the first transistor T1 with the fifth node N5 which is the first electrode of the light-emitting element ED. The gate electrode of the sixth transistor ST6 may be connected to the emission control line EML, the source electrode thereof may be connected to the second node N2, and the drain electrode thereof may be connected to the fifth node N5.

In an embodiment, when all of the fifth transistor ST5, the first transistor ST1 and the sixth transistor ST6 are turned on, the driving current may be supplied to the light-emitting element ED.

In an embodiment, the seventh transistor ST7 may be turned on by a fourth gate signal EB[n] of the fourth gate line EBL to electrically connect the fifth node N5 which is the first electrode of the light-emitting element ED with the second initialization voltage line VIL2. As the seventh transistor ST7 is turned on based on the fourth gate signal EBI[n], the first electrode of the light-emitting element ED may be discharged to the second initialization voltage. The gate electrode of the seventh transistor ST7 may be connected to the fourth gate line EBL, the source electrode thereof may be connected to the fifth node N5, and the drain electrode thereof may be connected to the second initialization voltage.

In an embodiment, the eighth transistor ST8 may be turned on by the fourth gate signal EB[n] of the fourth gate line EBL to electrically connect the bias voltage line VBL with the first node N1 which is the source electrode of the first transistor ST1. The eighth transistor ST8 may be turned on based on the fourth gate signal EB[n], thereby applying a bias voltage to the first node N1. The eighth transistor ST8 can improve hysteresis of the first transistor ST1 by applying the bias voltage to the source electrode of the first transistor ST1. The gate electrode of the eighth transistor ST8 may be connected to the fourth gate line EBL, the source electrode thereof may be connected to the bias voltage line VBL, and the drain electrode thereof may be connected to the first node N1.

In an embodiment, each of the first to eighth transistors ST1, ST2, ST3, ST4, ST5, ST6, ST7 and ST8, respectively, may include a silicon-based active layer. For example, each of the first to eighth transistors ST1, ST2, ST3, ST4, ST5, ST6, ST7 and ST8, respectively, may include an active layer made of low-temperature polycrystalline silicon (LTPS). The active layer made of low-temperature polycrystalline silicon may have a high electron mobility and excellent turn-on characteristics. Accordingly, as the display device 10 includes transistors having excellent turn-on characteristics, the plurality of pixels SP can be driven stably and efficiently.

In an embodiment, each of the first to eighth transistors ST1, ST2, ST3, ST4, ST5, ST6, ST7 and ST8, respectively, may be a p-type transistor. For example, each of the first to eighth transistors ST1, ST2, ST3, ST4, ST5, ST6, ST7 and ST8, respectively, may output a current flowing into the source electrode to the drain electrode in response to a gate-low voltage applied to the gate electrode.

As another example, at least one of the first to eighth transistors ST1, ST2, ST3, ST4, ST5, ST6, ST7 and ST8, respectively, may include an oxide-based active layer. A transistor including an oxide-based active layer may have a coplanar structure in which a gate electrode is disposed at the top. A transistor including an oxide-based active layer may be an n-type transistor and may output current introduced into the drain electrode via the source electrode based on a gate-high voltage applied to the gate electrode.

In an embodiment, the first capacitor C1 may be connected between the third node N3 which is the gate electrode of the first transistor ST1 and the driving voltage line VDDL. For example, the first capacitor electrode of the first capacitor C1 may be electrically connected to the third node N3, the second capacitor electrode of the first capacitor C1 may be electrically connected to the driving voltage line VDDL, such that the potential difference between the driving voltage line VDDL and the gate electrode of the first transistor ST1 can be held.

In an embodiment, the second capacitor C2 may be connected between the fourth node N4 and the driving voltage line VDDL. For example, the first capacitor electrode of the second capacitor C2 may be electrically connected to the source electrode of the third-first transistor ST3-1 and the drain electrode of the third-second transistor ST3-2, which are formed as one body, and the second capacitor electrode of the second capacitor C2 may be electrically connected to the driving voltage line VDDL, such that the potential difference between the driving voltage line VDDL and the fourth node N4 can be maintained.

In an embodiment and referring to FIG. 6 in conjunction with FIG. 5, when the display device 10 is driven at a predetermined driving frequency, one frame period may include at least one scanning period SCP and at least one blanking period BLP. The scanning period SCP may include first to fifth periods t1 to t5, respectively, and the blanking period BLP may include sixth and seventh periods t6 and t7, respectively.

In an embodiment, the fourth-first transistor ST4-1 and the fourth-second transistor ST4-2 may receive the third gate signal GI[n] at low-level during a first period t1. The fourth-first transistor ST4-1 and the fourth-second transistor ST4-2 may be turned on based on the third gate signal GI[n] at the low level, and may discharge the third node N3, which is the gate electrode of the first transistor ST1, to the first initialization voltage. Accordingly, the fourth-first transistor ST4-1 and the fourth-second transistor ST4-2 may initialize the gate electrode of the first transistor ST1 during the first period t1.

In an embodiment, the second transistor ST2 may receive the first gate signal GW[n] at the low level during a second period t2. The second transistor ST2 may be turned on based on the first gate signal GW[n] at the low level to apply data voltage to the first node N1, which is the source electrode of the first transistor ST1.

In an embodiment, the third-first transistor ST3-1 and the third-second transistor ST3-2 may receive the second gate signal GC[n] at low-level during a third period t3. The third-first transistor ST3-1 and the third-second transistor ST3-2 may be turned on based on the second gate signal GC[n] at the low level and may electrically connect the second node N2 with the third node N3. The current flows by a falling pulse FP of the second gate signal GC[n] will be described in detail with reference to FIGS. 10 and 11, and the current flows by a rising pulse RP of the second gate signal GC[n] will be described in detail with reference to FIGS. 12 and 13.

In an embodiment, the seventh transistor ST7 may receive the fourth gate signal EB[n] at the low level during the fourth period t4. The fourth gate signal EB[n] may decrease stepwise during the fourth period t4. The seventh transistor ST7 may be turned on based on the fourth gate signal EB[n] at the low-level and discharge the first electrode of the light-emitting element ED to the second initialization voltage. Accordingly, the seventh transistor ST7 may initialize the first electrode of the light-emitting element ED during the fourth period t4.

In an embodiment, the eighth transistor ST8 may receive the fourth gate signal EB [n] at the low level during the fourth period t4. The eighth transistor ST8 may be turned on based on the fourth gate signal EB[n] at the low level to apply bias voltage to the first node N1, which is the source electrode of the first transistor ST1. The eighth transistor ST8 may set the operating point or operating condition of the first transistor ST1 during the fourth period t4. The eighth transistor ST8 can prevent changes in the characteristics of the first transistor ST1 due to bias stress and improve hysteresis.

In an embodiment, when the source electrode of the first transistor ST1 receives the data voltage VDATA, the source-gate voltage Vsg of the first transistor ST1 may be equal to the difference voltage between the data voltage VDATA and the first initialization voltage VI1 (VDATA−VI1), and the source-gate voltage Vsg becomes greater than the threshold voltage Vth (VDATA−VI2>=Vth) and thus the first transistor ST1 may be turned on. Therefore, at the moment the second transistor ST2 is turned on in the second period t2, the source-drain current Isd of the first transistor ST1 may be determined based on the data voltage VDATA, the first initialization voltage VI1 and the threshold voltage Vth of the first transistor ST1 ($Isd=k\times(VDATA-VI1-Vth)^2$). The first transistor ST1 may supply the source-drain current Isd to the second node N2 until the source-gate voltage Vsg reaches the threshold voltage Vth of the first transistor ST1. In addition, the third-first transistor ST3-1 and the third-second transistor ST3-2 may be turned on during a third period t3 to supply the voltage of the second node N2 to the third node N3. In this manner, while the first transistor ST1 is turned on, the voltage at the third node N3 and the source-drain current Isd of the first transistor ST1 may be changed, and the voltage at the third node N3 may eventually converge to the difference voltage VDATA–Vth between the data voltage VDATA and the threshold voltage Vth of the first transistor ST1.

In an embodiment, the emission signal EM[n] may have a gate-low voltage during a fifth period t5. The emission signal EM[n] may decrease stepwise during the fifth period t5. When the emission signal EM[n] has the low level, the fifth and sixth transistors ST5 and ST6, respectively, may be turned on, to supply the driving current to the light-emitting element ED.

In an embodiment, the fourth gate signal EB [n] may have a gate-low voltage during a sixth period t6 of the blanking period BLP. Accordingly, the seventh transistor ST7 may initialize the fifth node N5, which is the first electrode of the light-emitting element ED, to the second initialization voltage even in the blanking period BLP. The eighth transistor ST8 may supply a bias voltage to the first node N1, which is the source electrode of the first transistor ST1, even in the blanking period BLP, and can improve the hysteresis of the first transistor ST1.

In an embodiment, the emission signal EM[n] may have a gate-low voltage during a seventh period t7 of the blanking period BLP. Accordingly, when the emission signal EM[n] has the low level, the fifth and sixth transistors ST5 and ST6, respectively, may be turned on, to supply the driving current to the initialized first electrode of the light-emitting element ED.

Figure 7:
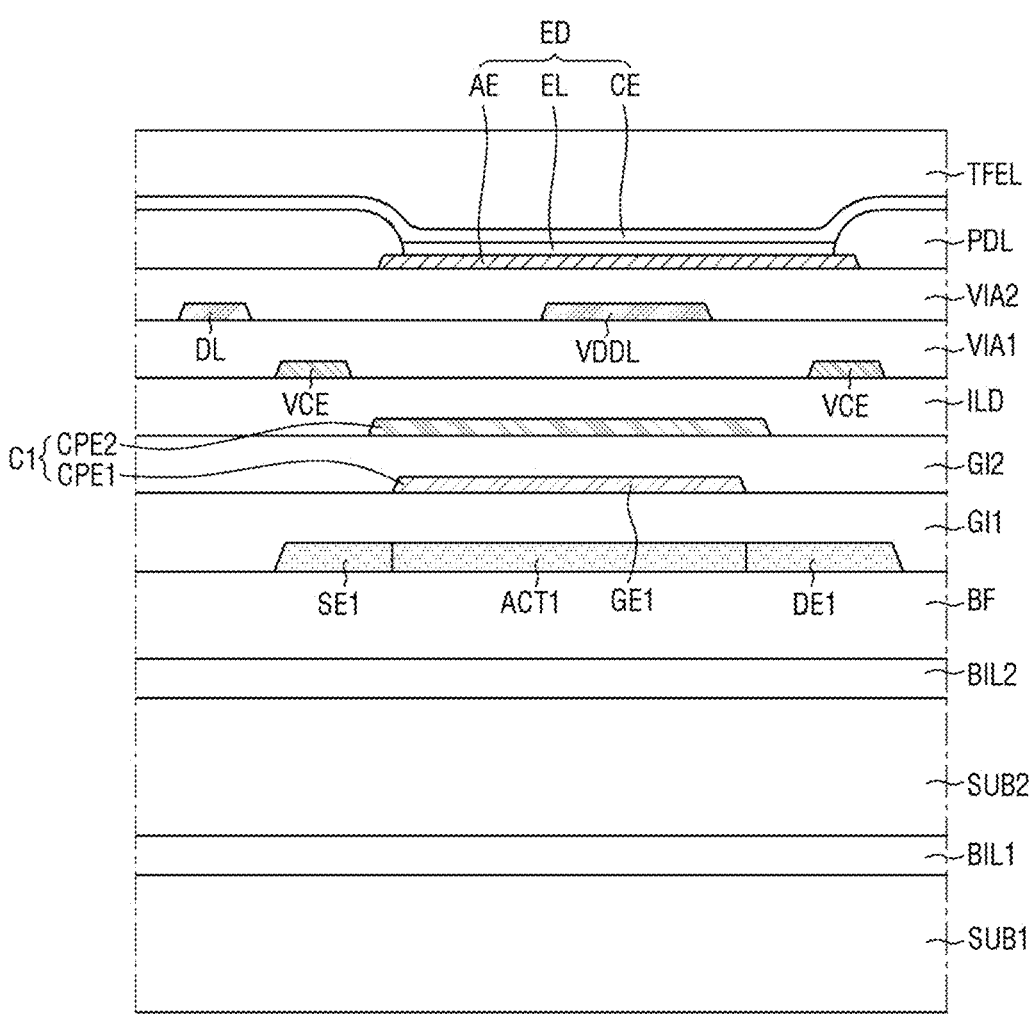
FIG. 7 is a cross-sectional view showing a pixel in a display device, according to an embodiment.

FIG. 7 is a cross-sectional view showing a pixel in a display device, according to an embodiment.

In an embodiment and referring to FIG. 7, the display panel 100 may include a first substrate SUB1, a first barrier insulating layer BIL1, a second substrate SUB2, a second barrier insulating layer BIL2, a buffer layer BF, an active layer ACTL, a first gate insulator GI1, a first gate layer GTL1, a second gate insulator GI2, a second gate layer GTL2, an interlayer dielectric layer ILD, a first source metal layer SDL1, a first via layer VIA1, a second source metal layer SDL2, a second via layer VIA2, a light-emitting element ED, a pixel-defining layer PDL, and an encapsulation layer TFEL.

In an embodiment, the first substrate SUB1 may be a base substrate or a base member. The first substrate SUB1 may be a flexible substrate that can be bent, folded, or rolled. For example, the first substrate SUB1 may include, but is not limited to, a polymer resin such as polyimide PI. In another embodiment, the first substrate SUB1 may include a glass material or a metal material.

In an embodiment, the first barrier insulating layer BIL1 may be disposed on the first substrate SUB1. The first barrier insulating layer BIL1 may include an inorganic insulating material capable of preventing permeation of air or moisture.

The first barrier insulating layer BIL1 may include, but is not limited to, at least one of a silicon nitride layer, a silicon oxynitride layer, a silicon oxide layer, a titanium oxide layer, an aluminum oxide layer, and an amorphous silicon layer.

In an embodiment, the second substrate SUB2 may be disposed on the first barrier insulating layer BILL. The second substrate SUB2 may be a flexible substrate that can be bent, folded, or rolled. The second substrate SUB2 may be made of the above-listed materials for the first substrate SUB1.

In an embodiment, the second barrier insulating layer BIL2 may be disposed on the second substrate SUB1. The second barrier insulating layer BIL2 may include an inorganic insulating material capable of preventing permeation of air or moisture. The second barrier insulating layer BIL2 may be made of one of the above-listed materials for the first barrier insulating layer BILL.

In an embodiment, the buffer layer BF may be disposed on the second barrier insulating layer BIL2. The buffer layer BF may include an inorganic insulating material that can prevent the permeation of air or moisture. The buffer layer BF may include, but is not limited to, at least one of a silicon nitride layer, a silicon oxynitride layer, a silicon oxide layer, a titanium oxide layer, an aluminum oxide layer, and an amorphous silicon layer.

In an embodiment, the active layer ACTL may be disposed on the buffer layer BF. The active layer ACTL may include a semiconductor region ACT1, a source electrode SE1 and a drain electrode DEL1 of the first transistor ST1.

In an embodiment, the first gate insulator GI1 may be disposed on the active layer ACTL and the buffer layer BF. The first gate insulator GI1 may insulate the gate electrode GE1 from the semiconductor region ACT1 of the first transistor ST1. The first gate insulator GI1 may include, but is not limited to, at least one of a silicon nitride layer, a silicon oxynitride layer, a silicon oxide layer, a titanium oxide layer, an aluminum oxide layer, and an amorphous silicon layer.

In an embodiment, the first gate layer GTL1 may be disposed on the first gate insulator GI1. The first gate layer GTL1 may include the gate electrode GE1 of the first transistor ST1 and the first capacitor electrode CPE1.

In an embodiment, the second gate insulator GI2 may be disposed on the first gate layer GTL1 and the first gate insulator GI1. The second gate insulator GI2 may insulate the first capacitor electrode CPE1 and a second capacitor electrode CPE2. The second gate insulator GI2 may be made of the above-listed materials for the first gate insulator GI1.

In an embodiment, the second gate layer GTL2 may be disposed on the second gate insulator GI2. The second gate layer GTL2 may include the second capacitor electrode CPE2.

In an embodiment, the interlayer dielectric layer ILD may be disposed on the second gate layer GTL2 and the second gate insulator GI2. The interlayer dielectric layer ILD may insulate the second gate layer GTL2 from the first source metal layer SDL1.

In an embodiment, the first source metal layer SDL1 may be disposed on the interlayer dielectric layer ILD. The first source metal layer SDL1 may include a connection electrode VCE. The connection electrode VCE may electrically connect lines or electrodes in the pixel circuit.

In an embodiment, the first via layer VIA1 may be disposed on the first source metal layer SDL1 and the interlayer dielectric layer ILD. For example, the first via layer VIA1 may include, but is not limited to, an organic insulating material such as polyimide PI.

In an embodiment, the second source metal layer SDL2 may be disposed on the first via layer VIA1. The second source metal layer SDL2 may include a data line DL and a driving voltage line VDDL.

In an embodiment, the second via layer VIA2 may be disposed on the second source metal layer SDL2 and the first via layer VIAL. For example, the second via layer VIA2 may include, but is not limited to, an organic insulating material such as polyimide PI.

In an embodiment, the pixel-defining layer PDL may be disposed on the second via layer VIA2. The pixel-defining layer PDL may define a plurality of emission areas or a plurality of openings. The pixel-defining layer PDL may separate and insulate the pixel electrodes AE of the pixels SP from one another.

In an embodiment, the light-emitting element ED may be disposed on the second via layer VIA2. The light-emitting element ED of each of the pixels SP may include a pixel electrode AE, an emissive layer EL, and a common electrode CE. The pixel electrode AE may be disposed on the second via layer VIA2. The pixel electrode AE may overlap with one of the plurality of emission areas defined by the pixel-defining layer PDL. The pixel electrode AE may receive a driving current from the pixel circuit of the pixel SP.

In an embodiment, the emissive layer EL may be disposed on the pixel electrode AE. For example, the emissive layer EL may be, but is not limited to, an organic emissive layer made of an organic material. If the emissive layer EL is an organic light-emitting layer, when the pixel circuit of the pixel SP applies a predetermined voltage to the pixel electrode AE and the common electrode CE receives a common voltage or cathode voltage, holes may move to the organic emissive layer EL through a hole transporting layer and electrons may move to the organic emissive layer EL through a hole transporting layer, and they combine in the organic emissive layer EL to emit light.

In an embodiment, the common electrode CE may be disposed on the emissive layer EL. For example, the common electrode CE may be implemented in the form of a common electrode extended across all of the sub-pixels SP. The common electrode CE may be disposed on the emissive layer EL in the emission areas and may be disposed on the pixel-defining layer PDL in the other areas than the emission area. The common electrode CE may be electrically connected to the low-level line VSSL may receive a low-level voltage.

In an embodiment, the encapsulation layer TFEL may be disposed on the common electrode CE to cover the light-emitting elements ED. The encapsulation layer TFEL may include at least one inorganic film to prevent permeation of oxygen or moisture into the light-emitting elements ED. The encapsulation layer TFEL may include at least one organic film to protect the light-emitting elements ED from particles such as dust.

Figure 8:
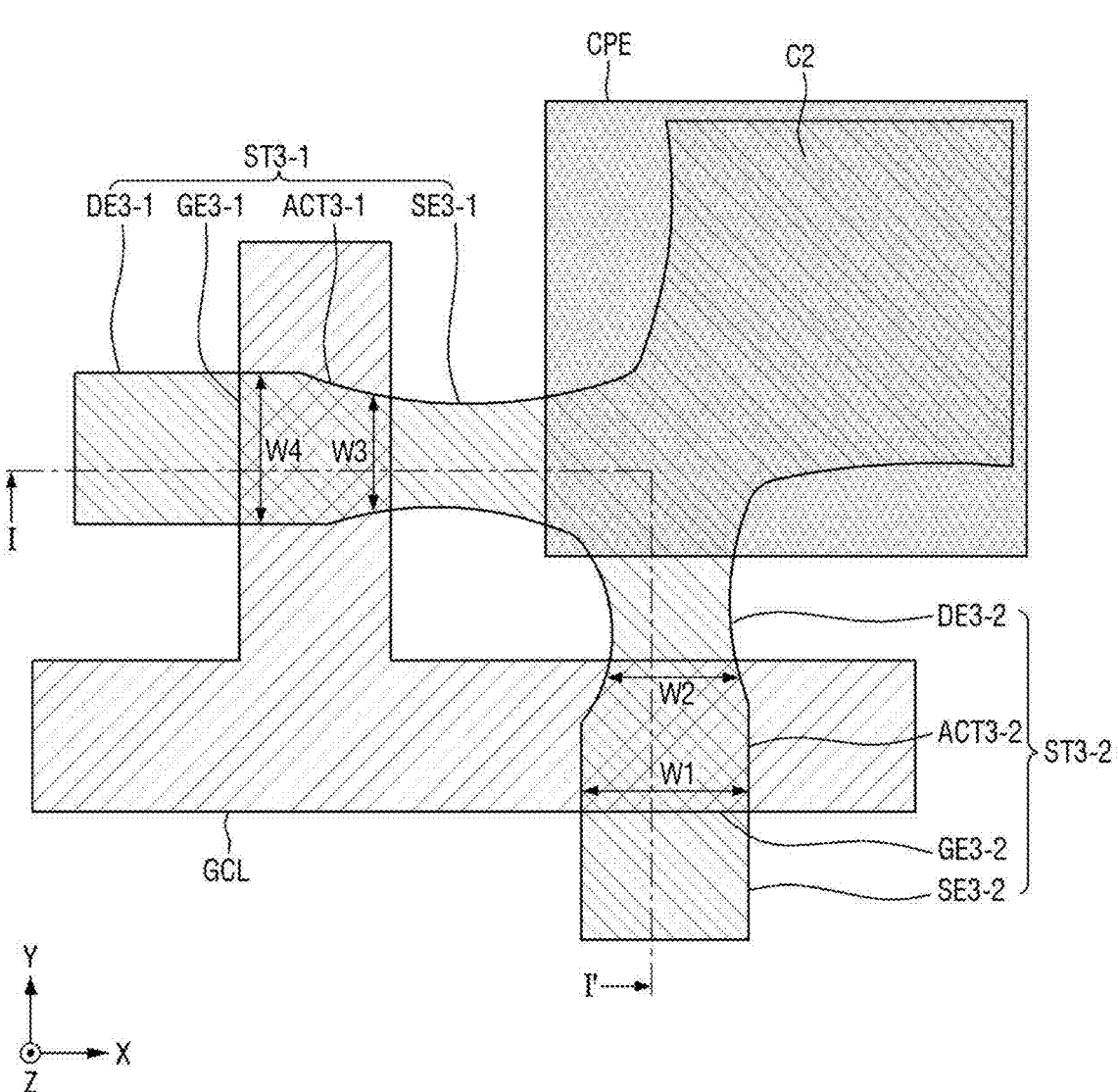
FIG. 8 is a layout diagram showing a third-first transistor and a (2-3) transistor of a pixel, according to an embodiment.
Figure 9:
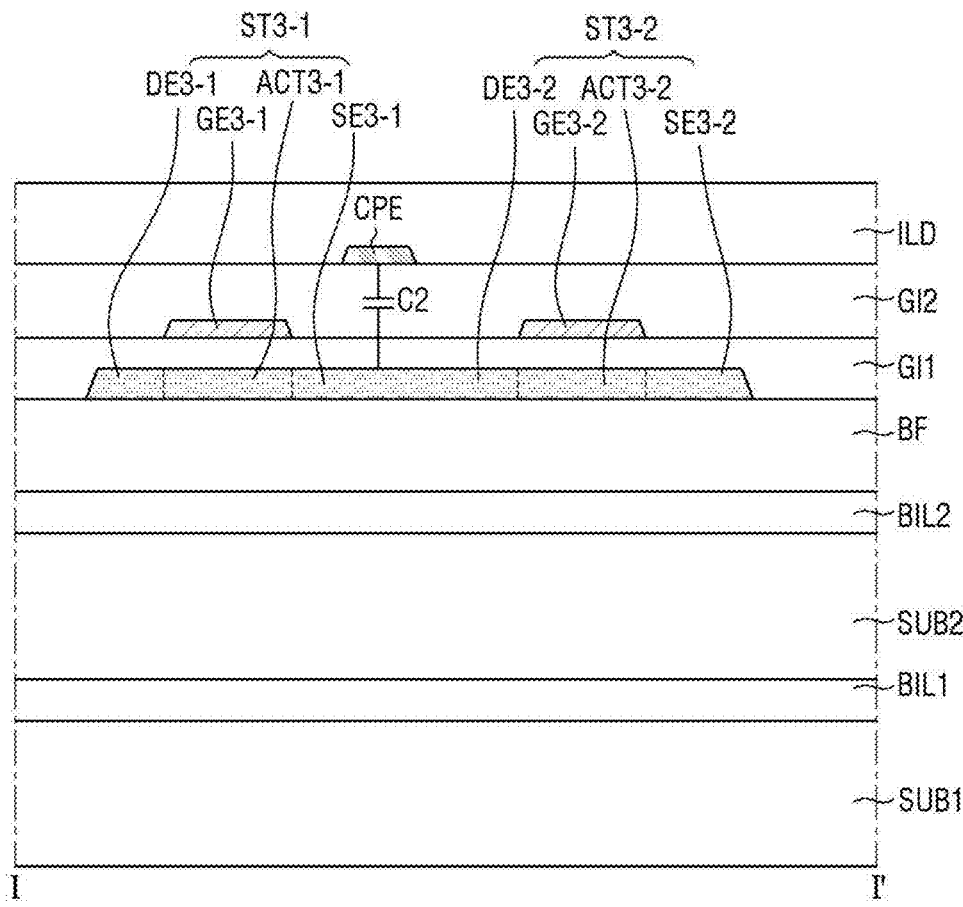
FIG. 9 is a cross-sectional view of the layout diagram, taken along line I-I' of FIG. 8, according to an embodiment.

FIG. 8 is a layout diagram showing a third-first transistor and a (2-3) transistor of a pixel, according to an embodiment. FIG. 9 is a cross-sectional view, taken along line I-I' of FIG. 8, according to an embodiment.

In an embodiment and referring to FIGS. 8 and 9, the third transistor ST3 may include a third-first transistor ST3-1 and a third-second transistor ST3-2 connected in series. The third-first transistor ST3-1 may include a semiconductor region ACT3-1, a gate electrode GE3-1, a source electrode SE3-1, and a drain electrode DE3-1, and the third-second transistor ST3-2 may include a semiconductor region ACT3-2, a gate electrode GE3-2, a source electrode SE3-2, and a drain electrode DE3-2. The semiconductor regions ACT3-1 and ACT3-2, the source electrodes SE3-1 and SE3-2, and the drain electrodes DE3-1 and DE3-2 of the third-first transistor ST3-1 and the third-second transistor ST3-2, respectively, may be disposed in the active layer ACTL, and the gate electrodes GE3-1 and GE3-2 may be disposed in the first gate layer GTL1.

In an embodiment, the gate electrode GE3-1 of the third-first transistor ST3-1 may extend from the second gate line GCL in the y-axis direction to overlap with the semiconductor region ACT3-1 of the third-first transistor ST3-1. The gate electrode GE3-2 of the third-second transistor ST3-2 may extend from the second gate line GCL in the x-axis direction to overlap with the semiconductor region ACT3-2 of the third-second transistor ST3-2.

In an embodiment, one side of the semiconductor region ACT3-2 disposed adjacent to the source electrode SE3-2 of the third-second transistor ST3-2 may have a first width W1. The other side of the semiconductor region ACT3-2 disposed adjacent to the drain electrode DE3-2 of the third-second transistor ST3-2 may have a second width W2. The first width W1 may be greater than the second width W2.

In an embodiment, the gate electrode GE3-2 of the third-second transistor ST3-2 may be a region of the second gate line GCL that overlaps with the semiconductor region ACT3-2 of the third-second transistor ST3-2. Accordingly, one side of the gate electrode GE3-2 disposed adjacent to the source electrode SE3-2 of the third-second transistor ST3-2 may have a first width W1. The other side of the gate electrode GE3-2 disposed adjacent to the drain electrode DE3-2 of the third-second transistor ST3-2 may have a second width W2.

In an embodiment, one side of the semiconductor region ACT3-1 disposed adjacent to the source electrode SE3-1 of the third-first transistor ST3-1 may have a third width W3. The other side of the semiconductor region ACT3-1 disposed adjacent to the drain electrode DE3-1 of the third-first transistor ST3-1 may have a fourth width W4. The first width W4 may be greater than the third width W3. The second width W2 may be substantially equal to the third width W3, but the invention is not limited thereto. The first width W1 may be substantially equal to the fourth width W4, but the invention is not limited thereto.

In an embodiment, the gate electrode GE3-1 of the third-first transistor ST3-1 may be a region of the second gate line GCL that overlaps with the semiconductor region ACT3-1 of the third-first transistor ST3-1. Accordingly, one side of the gate electrode GE3-1 disposed adjacent to the source electrode SE3-1 of the third-first transistor ST3-1 may have a third width W3. The other side of the gate electrode GE3-1 disposed adjacent to the drain electrode DE3-1 of the third-first transistor ST3-1 may have a fourth width W4.

In an embodiment, the display device 10 can reduce leakage current or off-current flowing through the third-first transistor ST3-1 and the third-second transistor ST3-2 and can reduce the threshold voltage shift. Accordingly, the third-first transistor ST3-1 and the third-second transistor ST3-2 can have excellent leakage current or off-current characteristics. The third-first transistor ST3-1 and the third-second transistor ST3-2 can prevent leakage current and can maintain the voltage inside the pixel SP stably.

In an embodiment, the source electrode of the third-first transistor ST3-1 and the drain electrode of the third-second transistor ST3-2 may be formed as one body and may correspond to the fourth node N4 of FIG. 5. A capacitor electrode CPE may be disposed in the second gate layer GTL2 and electrically connected to the driving voltage line VDDL. The first capacitor electrode of the second capacitor C2 may correspond to the fourth node N4, and the second capacitor electrode of the second capacitor C2 may correspond to the capacitor electrode CPE. The second capacitor C2 may be formed between the fourth node N4 and the capacitor electrode CPE to reduce the kickback voltage. As the second capacitor C2 stably maintains the voltages of the source electrode SE3-1 of the third-first transistor ST3-1 and the drain electrode DE3-2 of the third-second transistor ST3-2, it is possible to reduce leakage current flowing through the third-first transistor ST3-1 and the third-second transistor ST3-2.

Figure 10:
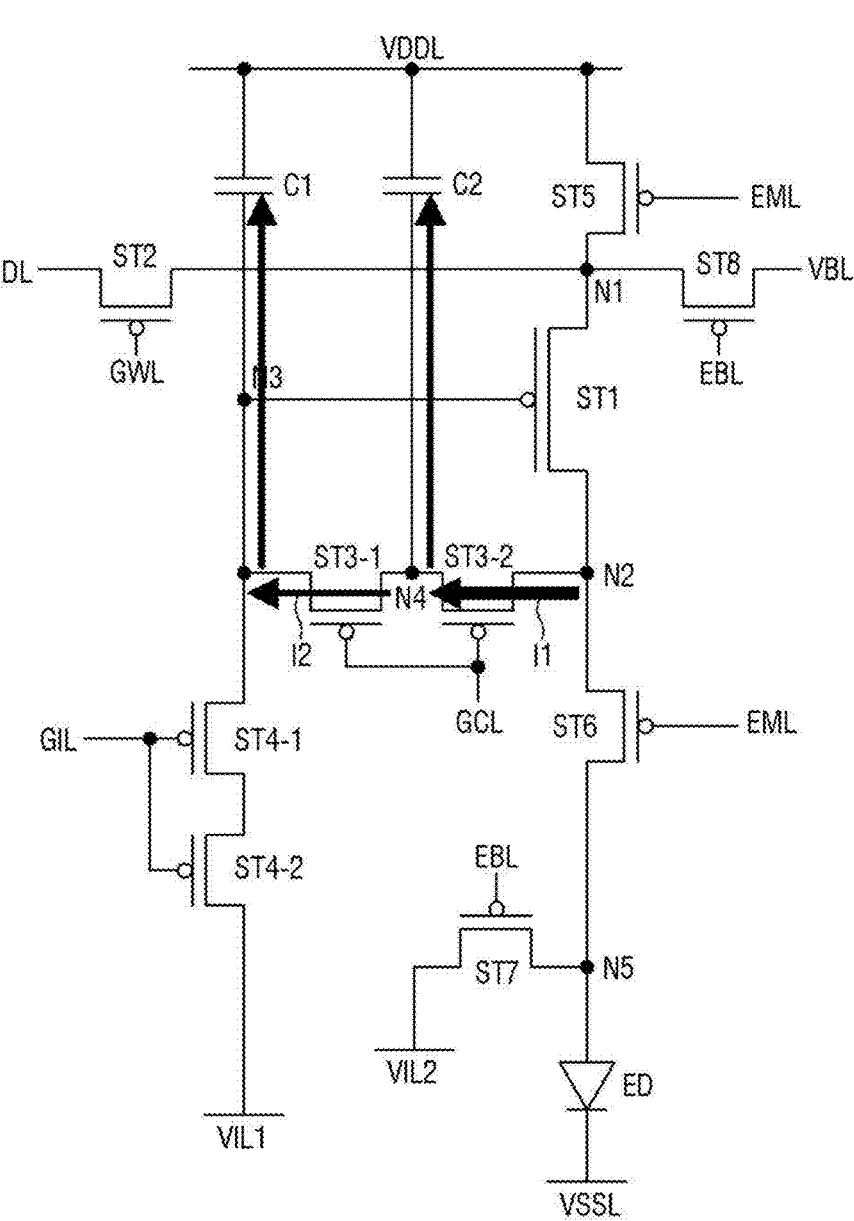
FIG. 10 is a circuit diagram showing current flows by a falling pulse of a second gate signal in a display device, according to an embodiment.
Figure 11:
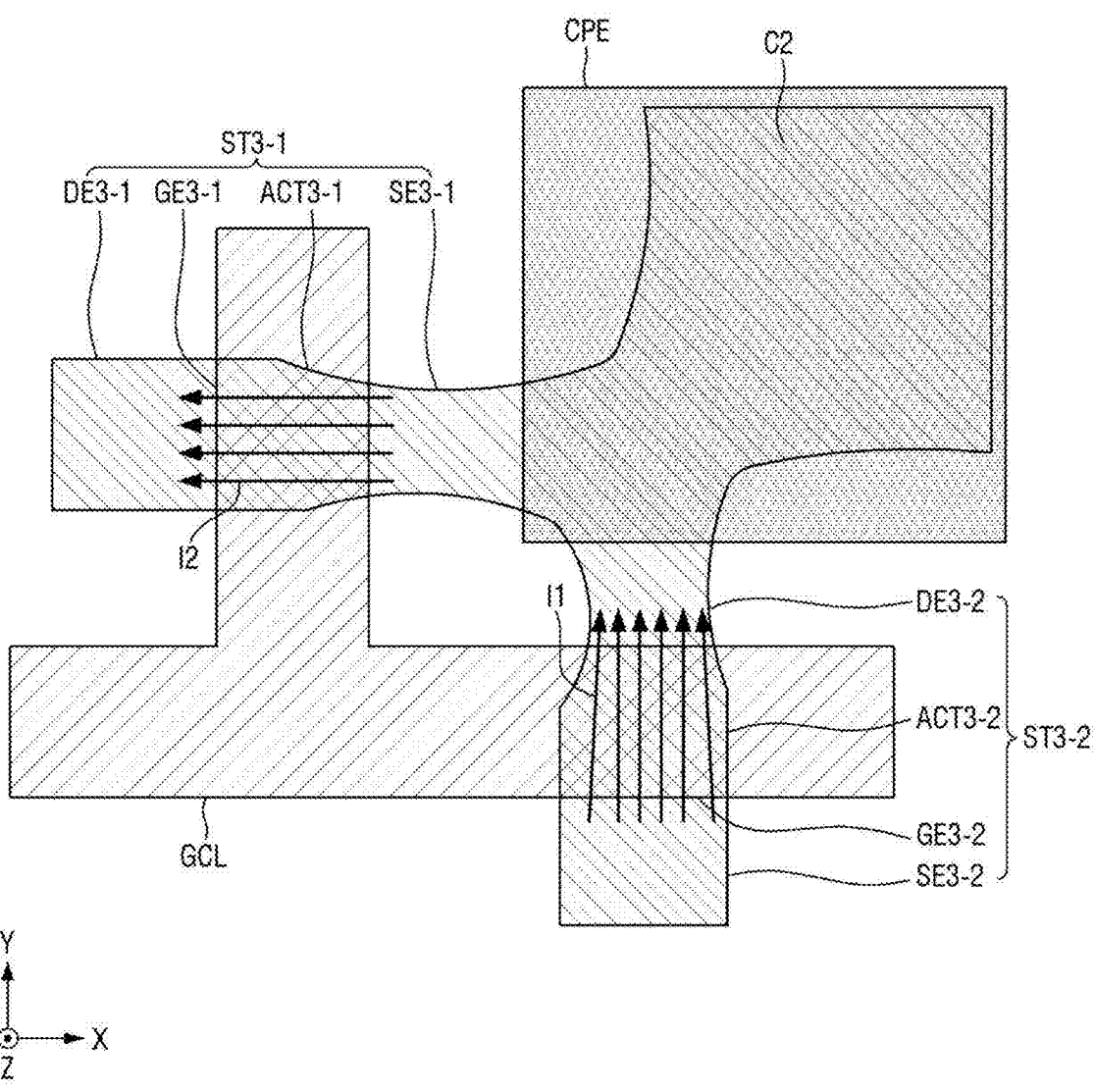
FIG. 11 is a layout diagram showing the current flows by the falling pulse of the second gate signal in the display device, according to an embodiment.

FIG. 10 is a circuit diagram showing current flows by a falling pulse of a second gate signal in a display device, according to an embodiment. FIG. 11 is a layout diagram showing the current flows by the falling pulse of the second gate signal in a display device, according to an embodiment.

In an embodiment and referring to FIGS. 10 and 11, the third-first transistor ST3-1 and the third-second transistor ST3-2 may be turned on by receiving the second gate signal GC[n] at the low-level.

In an embodiment and referring to FIG. 6, when the second gate signal GC[n] is switched to the low level through the falling pulse FP of the second gate signal GC[n], the third-first transistor ST3-1 and the third-second transistor (ST3-2) may be turned on. When the third-second transistor ST3-2 is turned on, a first current I1 may flow from the source electrode SE3-2 to the drain electrode DE3-2. Since the first width W1 on one side of the semiconductor region ACT3-2 of the third-second transistor ST3-2 is greater than the second width W2 on the other side of the semiconductor region ACT3-2, the first current I1 can quickly pass through the third-second transistor ST3-2.

In an embodiment, when the third-first transistor ST3-1 is turned on, a second current I2 may flow from the source electrode SE3-1 to the drain electrode DE3-1. A part of the first current I1 may flow in the third-first transistor ST3-1 as the second current I2, and another part of the first current I1 may charge the first capacitor electrode of the second capacitor C2 or the fourth node N4. The second current I2 may reach the gate electrode of the first transistor ST1 to compensate for the threshold voltage Vth of the first transistor ST1. Accordingly, as the intensity of the first current I1 increases, the intensity of the second current I2 may increase, and the threshold voltage Vth of the first transistor ST1 may be quickly compensated for. The intensity of each of the first and second currents I1 and I2 may be proportional to the number of the respective arrows shown in FIG. 11. Another part of the first current I1 may charge the first capacitor electrode of the second capacitor C2 or the fourth node N4, thereby reducing the kickback voltage of the fourth node N4.

Figure 12:
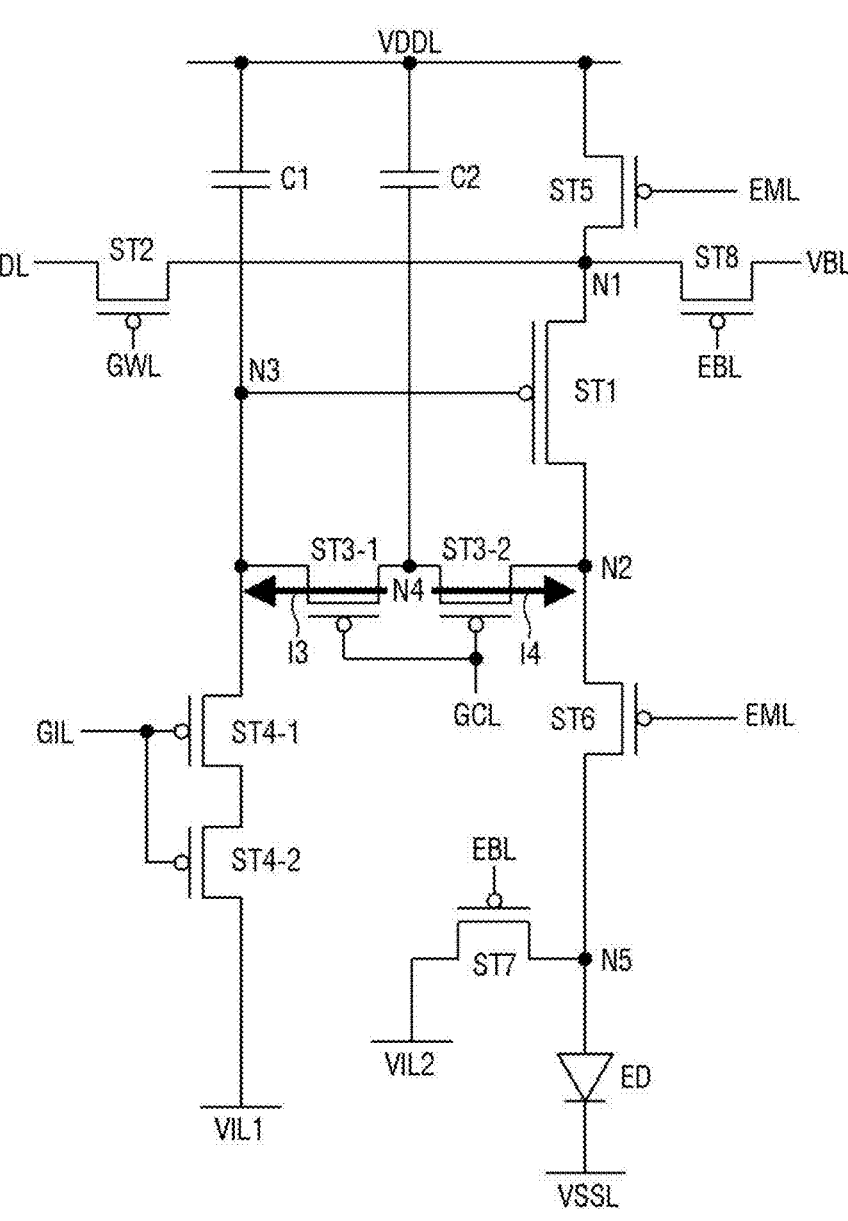
FIG. 12 is a circuit diagram showing current flows by a rising pulse of a second gate signal in a display device, according to an embodiment.
Figure 13:
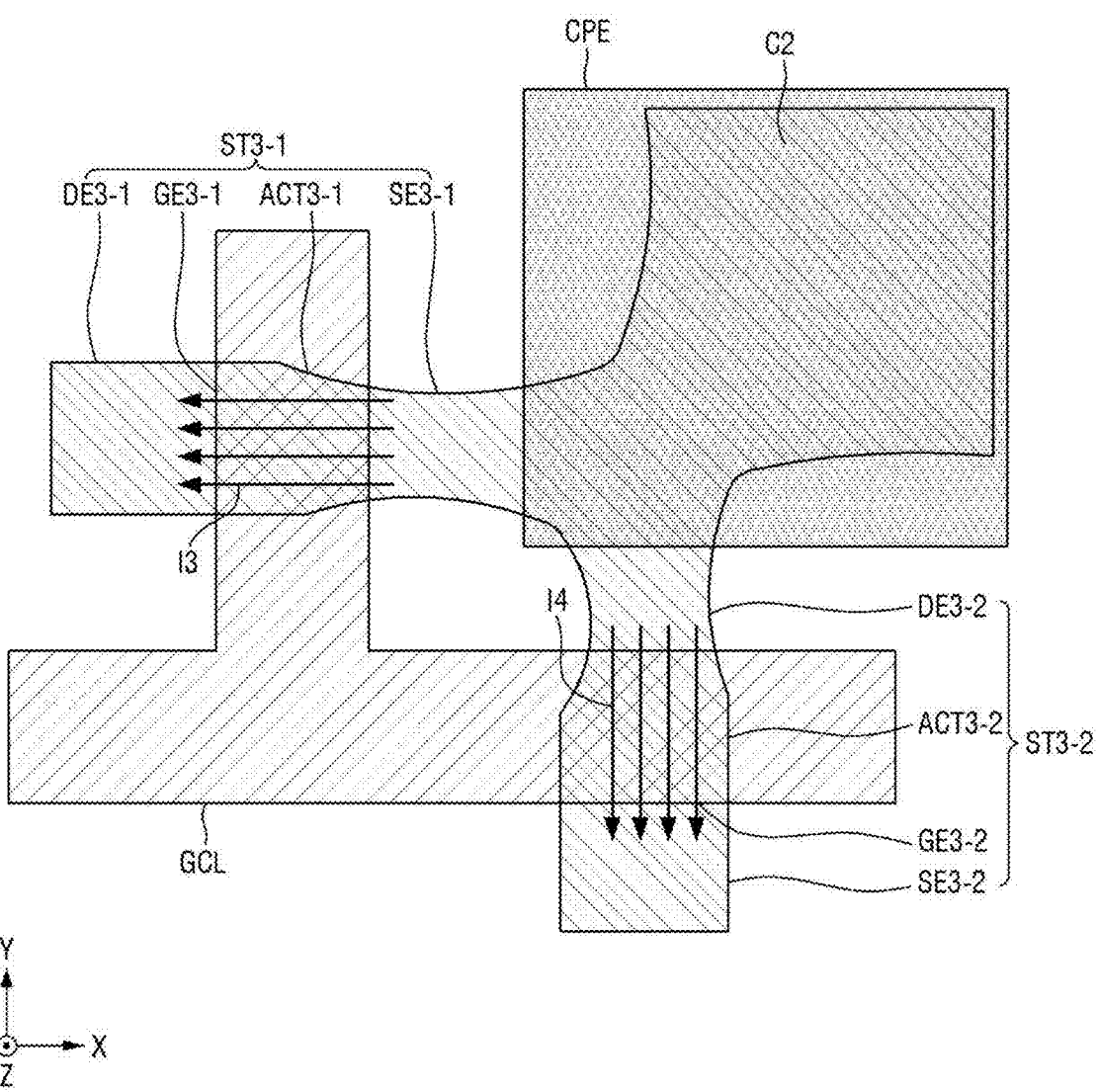
FIG. 13 is a layout diagram showing the current flows by the rising pulse of the second gate signal in the display device, according to an embodiment.

FIG. 12 is a circuit diagram showing current flows by a rising pulse of a second gate signal in a display device, according to an embodiment. FIG. 13 is a layout diagram showing the current flows by the rising pulse of the second gate signal in a display device, according to an embodiment.

In an embodiment and referring to FIGS. 12 and 13, the third-first transistor ST3-1 and the third-second transistor ST3-2 may be turned off by receiving the second gate signal GC[n] at the high-level.

In an embodiment and referring to FIG. 6, at the moment the second gate signal GC[n] has a rising pulse RP, the kickback voltage of the fourth node N4 may occur. When the kickback voltage of the fourth node N4 occurs, the voltage of the fourth node N4 may instantly become higher than the voltage of the third node N3, and a third current I3 may flow from the source electrode SE3-1 of the third-first transistor ST3-1 to the drain electrode DE3-1 as leakage current or off-current. Since the third width W3 on one side of the semiconductor region ACT3-1 of the third-first transistor ST3-1 is smaller than the fourth width W4 on the other side of the semiconductor region ACT3-1, the third current I3 cannot quickly pass through the third-first transistor ST3-1. In other words, the leakage current or off-current passing through the third-first transistor ST3-1 may be reduced. The intensity of the third current I3 may be proportional to the number of arrows of the third current I3 shown in FIG. 13. The intensity of the current of one arrow in FIG. 13 may be different from the intensity of the current of one arrow in FIG. 11.

In an embodiment, when the kickback voltage of the fourth node N4 occurs, the voltage of the fourth node N4 may instantly become higher than the voltage of the second node N2, and a fourth current I4 may flow from the drain electrode DE3-2 of the third-second transistor ST3-2 to the source electrode SE3-2 as leakage current or off-current. Since the second width W2 on the other side of the semiconductor region ACT3-2 of the third-second transistor ST3-2 is smaller than the first width W1 on one side of the semiconductor region ACT3-2, the fourth current I4 cannot quickly pass through the third-second transistor ST3-2. In other words, the leakage current or off-current passing through the third-second transistor ST3-2 may be reduced. The intensity of the fourth current I4 may be proportional to the number of arrows of the fourth current I4 shown in FIG. 13.

In an embodiment, as described above with reference to FIGS. 11 and 12, the fourth node N4 is charged by another part of the first current I1, so that the kickback voltage of the fourth node N4 may be relatively reduced.

In an embodiment, since the first width W1 on one side of the semiconductor region ACT3-2 of the third-second transistor ST3-2 is greater than the second width W2 on the other side of the semiconductor region ACT3-2 of the third-second transistor ST3-2, the kickback voltage of the fourth node N4 may be reduced and the leakage current or off-current exiting the third-second transistor ST3-2 may be reduced. Since the third width W3 on one side of the semiconductor region ACT3-1 of the third-first transistor ST3-1 is smaller than the fourth width W4 on the other side of the semiconductor region ACT3-1 of the third-first transistor ST3-1, the kickback voltage of the fourth node N4 may be reduced and the leakage current or off-current exiting the third-second transistor ST3-2 may be reduced. Accordingly, the third-first transistor ST3-1 and the third-second transistor ST3-2 can prevent leakage current and can maintain the voltage inside the pixel SP stably.

Figure 14:
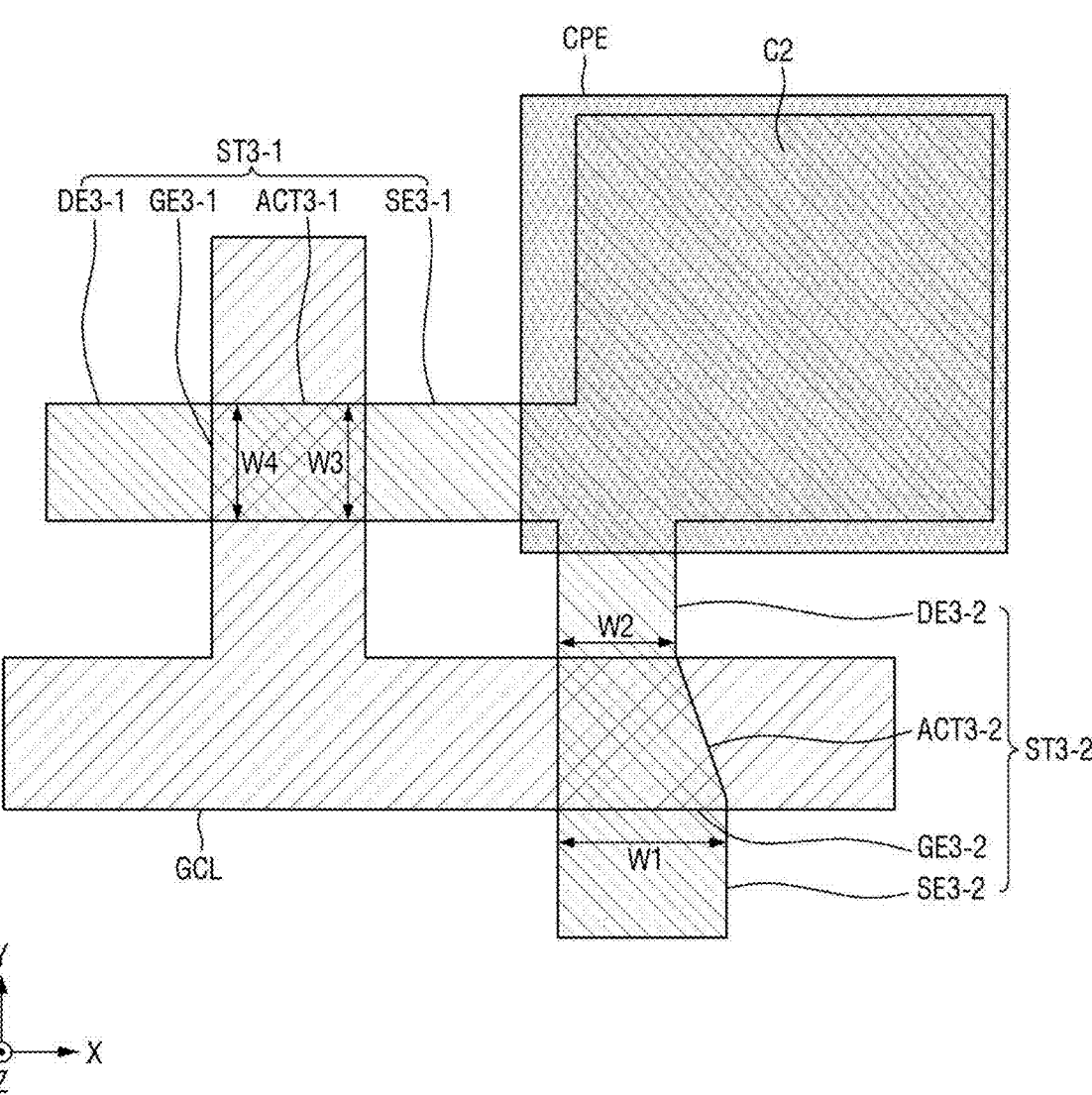
FIG. 14 is a layout diagram showing a third-first transistor and a (2-3) transistor of a pixel, according to another embodiment.

FIG. 14 is a layout diagram showing a third-first transistor and a (2-3) transistor of a pixel, according to another embodiment. In the following description, the same elements as those described above will be briefly described or omitted.

In an embodiment and referring to FIG. 14, the third transistor ST3 may include a third-first transistor ST3-1 and a third-second transistor ST3-2 connected in series. The third-first transistor ST3-1 may include a semiconductor region ACT3-1, a gate electrode GE3-1, a source electrode SE3-1, and a drain electrode DE3-1, and the third-second transistor ST3-2 may include a semiconductor region ACT3-2, a gate electrode GE3-2, a source electrode SE3-2, and a drain electrode DE3-2.

In an embodiment, one side of the semiconductor region ACT3-2 disposed adjacent to the source electrode SE3-2 of the third-second transistor ST3-2 may have a first width W1. The other side of the semiconductor region ACT3-2 disposed adjacent to the drain electrode DE3-2 of the third-second transistor ST3-2 may have a second width W2. The first width W1 may be greater than the second width W2.

In an embodiment, the semiconductor region ACT3-2 of the third-second transistor ST3-2 may have a trapezoidal shape. The semiconductor region ACT3-2 of the third-second transistor ST3-2 may include a first side extended in the x-axis direction and having a first length equal to the first width W1, a second side extended parallel to the first side and having a second length equal to the second width W2, a third side extended in the y-axis direction between the left side of the first side and the left side of the second side, and a fourth side extended diagonally between the direction opposite to the x-axis and the y-axis direction between the right side of the first side and the right side of the second side.

In an embodiment, the gate electrode GE3-2 of the third-second transistor ST3-2 may be a region of the second gate line GCL that overlaps with the semiconductor region ACT3-2 of the third-second transistor ST3-2. Accordingly, one side of the gate electrode GE3-2 disposed adjacent to the source electrode SE3-2 of the third-second transistor ST3-2 may have a first width W1. The other side of the gate electrode GE3-2 disposed adjacent to the drain electrode DE3-2 of the third-second transistor ST3-2 may have a second width W2.

In an embodiment, the gate electrode GE3-2 of the third-second transistor ST3-2 may have a trapezoidal shape. The gate electrode GE3-2 of the third-second transistor ST3-2 may include a first side extended in the x-axis direction and having a first length equal to the first width W1, a second side extended parallel to the first side and having a second length equal to the second width W2, a third side extended in the y-axis direction between the left side of the first side and the left side of the second side, and a fourth side extended diagonally between the direction opposite to the x-axis and the y-axis direction between the right side of the first side and the right side of the second side.

In an embodiment, one side of the semiconductor region ACT3-1 disposed adjacent to the source electrode SE3-1 of the third-first transistor ST3-1 may have a third width W3. The other side of the semiconductor region ACT3-1 disposed adjacent to the drain electrode DE3-1 of the third-first transistor ST3-1 may have a fourth width W4. The third width W3 may be substantially equal to the fourth width W4. The second width W2 may be substantially equal to the third width W3, but the invention is not limited thereto.

In an embodiment, the gate electrode GE3-1 of the third-first transistor ST3-1 may be a region of the second gate line GCL that overlaps with the semiconductor region ACT3-1 of the third-first transistor ST3-1. Accordingly, one side of the gate electrode GE3-1 disposed adjacent to the source electrode SE3-1 of the third-first transistor ST3-1 may have a third width W3. The other side of the gate electrode GE3-1 disposed adjacent to the drain electrode DE3-1 of the third-first transistor ST3-1 may have a fourth width W4.

In an embodiment, the display device 10 can reduce leakage current or off-current flowing through the third-first transistor ST3-1 and the third-second transistor ST3-2 and can reduce the threshold voltage shift. Accordingly, the third-first transistor ST3-1 and the third-second transistor ST3-2 can have excellent leakage current or off-current characteristics. The third-first transistor ST3-1 and the third-second transistor ST3-2 can prevent leakage current and can maintain the voltage inside the pixel SP stably.

In an embodiment, the source electrode of the third-first transistor ST3-1 and the drain electrode of the third-second transistor ST3-2 may be formed as one body and may correspond to the fourth node N4 of FIG. 5. A capacitor electrode CPE may be disposed in the second gate layer GTL2 and electrically connected to the driving voltage line VDDL. The first capacitor electrode of the second capacitor C2 may correspond to the fourth node N4, and the second capacitor electrode of the second capacitor C2 may correspond to the capacitor electrode CPE. The second capacitor C2 may be formed between the fourth node N4 and the capacitor electrode CPE to reduce the kickback voltage. As the second capacitor C2 stably maintains the voltages of the source electrode SE3-1 of the third-first transistor ST3-1 and the drain electrode DE3-2 of the third-second transistor ST3-2, it is possible to reduce leakage current flowing through the third-first transistor ST3-1 and the third-second transistor ST3-2.

Figure 15:
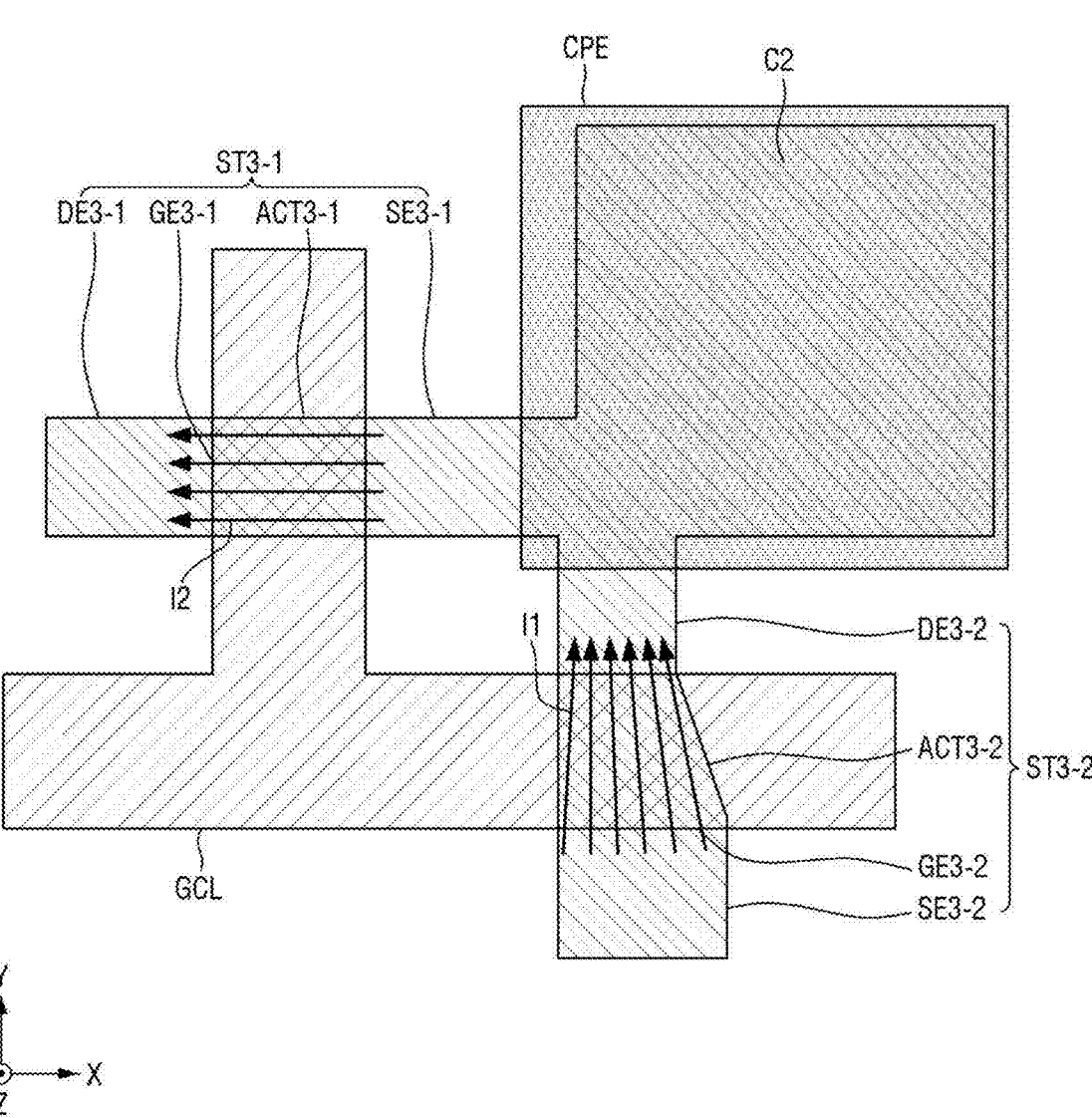
FIG. 15 is a layout diagram showing current flows by a falling pulse of a second gate signal in a display device, according to another embodiment.

FIG. 15 is a layout diagram showing current flows by a falling pulse of a second gate signal in a display device, according to another embodiment.

In an embodiment and referring to FIG. 15, the third-first transistor ST3-1 and the third-second transistor ST3-2 may be turned on by receiving the second gate signal GC[n] at the low-level.

In an embodiment and referring to FIG. 6, when the second gate signal GC[n] is switched to the low level through the falling pulse FP of the second gate signal GC[n], the third-first transistor ST3-1 and the third-second transistor (ST3-2) may be turned on. When the third-second transistor ST3-2 is turned on, a first current I1 may flow from the source electrode SE3-2 to the drain electrode DE3-2. Since the first width W1 on one side of the semiconductor region ACT3-2 of the third-second transistor ST3-2 is greater than the second width W2 on the other side of the semiconductor region ACT3-2, the first current I1 can quickly pass through the third-second transistor ST3-2.

In an embodiment, when the third-first transistor ST3-1 is turned on, a second current I2 may flow from the source electrode SE3-1 to the drain electrode DE3-1. A part of the first current I1 may flow in the third-first transistor ST3-1 as the second current I2, and another part of the first current I1 may charge the first capacitor electrode of the second capacitor C2 or the fourth node N4. The second current I2 may reach the gate electrode of the first transistor ST1 to compensate for the threshold voltage Vth of the first transistor ST1. Accordingly, as the intensity of the first current I1 increases, the intensity of the second current I2 may increase, and the threshold voltage Vth of the first transistor ST1 may be quickly compensated for. The intensity of each of the first and second currents I1 and I2 may be proportional to the number of the respective arrows shown in FIG. 15. Another part of the first current I1 may charge the first capacitor electrode of the second capacitor C2 or the fourth node N4, thereby reducing the kickback voltage of the fourth node N4.

Figure 16:
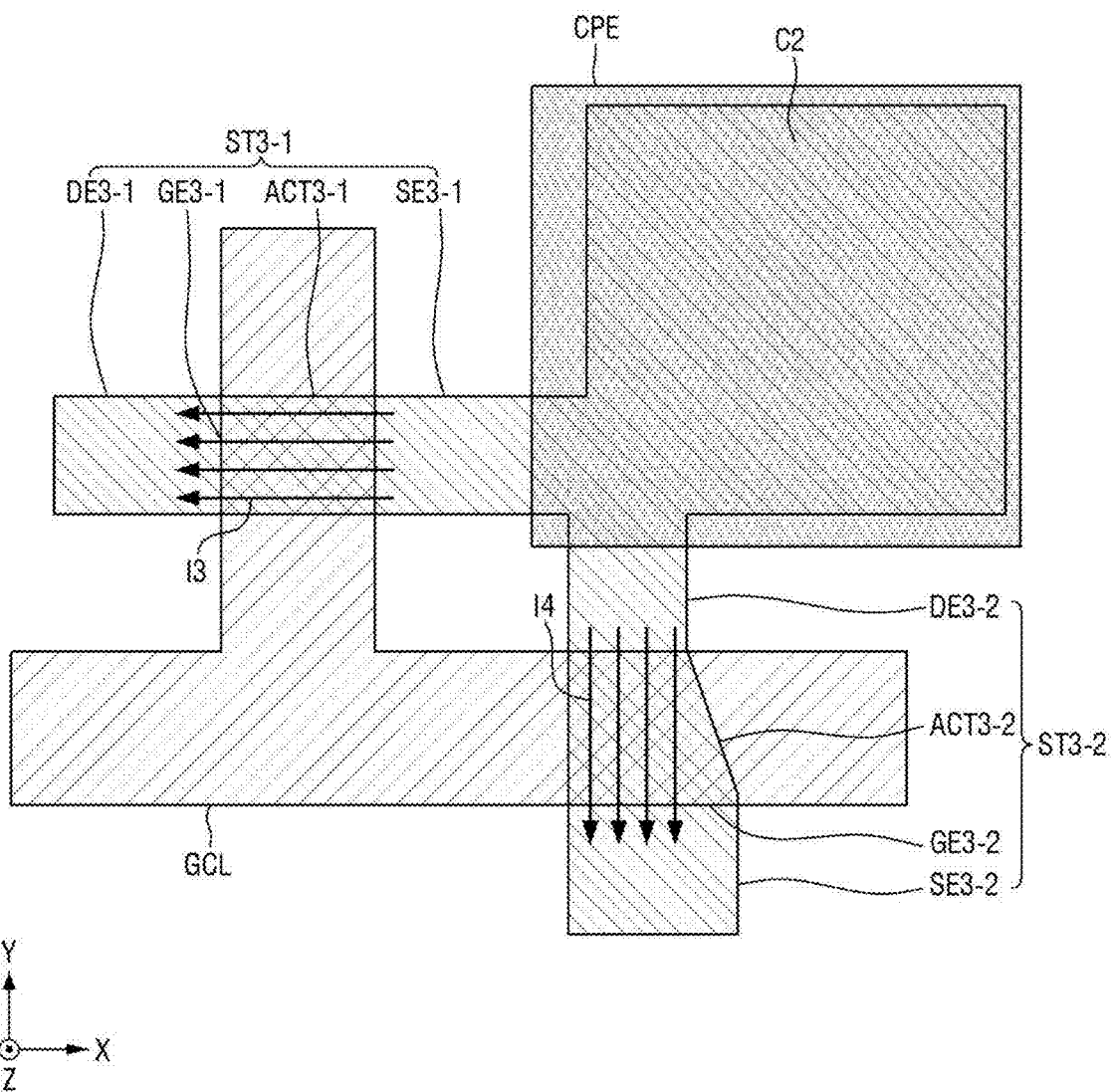
FIG. 16 is a layout diagram showing current flows by a rising pulse of a second gate signal in a display device, according to another embodiment.

FIG. 16 is a layout diagram showing current flows by a rising pulse of a second gate signal in a display device, according to another embodiment.

In an embodiment and referring to FIG. 16, the third-first transistor ST3-1 and the third-second transistor ST3-2 may be turned off by receiving the second gate signal GC[n] at the high-level.

In an embodiment and referring to FIG. 6, at the moment the second gate signal GC[n] has a rising pulse RP, the kickback voltage of the fourth node N4 may occur. When the kickback voltage of the fourth node N4 occurs, the voltage of the fourth node N4 may instantly become higher than the voltage of the third node N3, and a third current I3 may flow from the source electrode SE3-1 of the third-first transistor ST3-1 to the drain electrode DE3-1 as leakage current or off-current. Since the third width W3 on one side of the semiconductor region ACT3-1 of the third-first transistor ST3-1 may be substantially equal to the fourth width W4 on the other side of the semiconductor region ACT3-1, and the third width W3 and fourth width W4 are smaller than the first width W1, the third current I3 cannot quickly pass through the third-first transistor ST3-1. In other words, the leakage current or off-current passing through the third-first transistor ST3-1 may be reduced. The intensity of the third current I3 may be proportional to the number of arrows of the third current I3 shown in FIG. 16. The intensity of the current of one arrow in FIG. 16 may be different from the intensity of the current of one arrow in FIG. 15.

In an embodiment, when the kickback voltage of the fourth node N4 occurs, the voltage of the fourth node N4 may instantly become higher than the voltage of the second node N2, and a fourth current I4 may flow from the drain electrode DE3-2 of the third-second transistor ST3-2 to the source electrode SE3-2 as leakage current or off-current. Since the second width W2 on the other side of the semiconductor region ACT3-2 of the third-second transistor ST3-2 is smaller than the first width W1 on one side of the semiconductor region ACT3-2, the fourth current I4 cannot quickly pass through the third-second transistor ST3-2. In other words, the leakage current or off-current passing through the third-second transistor ST3-2 may be reduced. The intensity of the fourth current I4 may be proportional to the number of arrows of the fourth current I4 shown in FIG. 16.

In an embodiment, as described above with reference to FIG. 15, the fourth node N4 is charged by another part of the first current I1, so that the kickback voltage of the fourth node N4 may be relatively reduced.

In an embodiment, since the first width W1 on one side of the semiconductor region ACT3-2 of the third-second transistor ST3-2 is greater than the second width W2 on the other side of the semiconductor region ACT3-2 of the third-second transistor ST3-2, the kickback voltage of the fourth node N4 may be reduced and the leakage current or off-current exiting the third-second transistor ST3-2 may be reduced. Since the third width W3 on one side of the semiconductor region ACT3-1 of the third-first transistor ST3-1 may be substantially identical to the fourth width W4 on the other side of the semiconductor region ACT3-1 of the third-first transistor ST3-1, the leakage current or off-current exiting the third-second transistor ST3-2 may be reduced. Accordingly, the third-first transistor ST3-1 and the third-second transistor ST3-2 can prevent leakage current and can maintain the voltage inside the pixel SP stably.

The invention should not be construed as being limited to the embodiments set forth herein. Rather, these embodiments are provided so that this disclosure will be thorough and complete and will fully convey the invention to those skilled in the art. While the invention has been particularly shown and described with reference to embodiments thereof, it will be understood by those of ordinary skill in the art that various changes in form and details may be made therein without departing from the spirit or scope of the invention. Moreover, the embodiments or parts of the embodiments may be combined in whole or in part without departing from the scope of the invention.

What is claimed is:

1. A display device comprising:
a light-emitting element disposed on a substrate;
a driving transistor for controlling a driving current flowing in the light-emitting element;
a second transistor for applying a data voltage to a source electrode of the driving transistor;
a third-first transistor connected to a gate electrode of the driving transistor; and
a third-second transistor connected between a source electrode of the third-first transistor and a drain electrode of the driving transistor,
wherein one side of a semiconductor region of the third-second transistor disposed in direct physical contact with a source electrode of the third-second transistor has a first width, and another side of the semiconductor region of the third-second transistor disposed in direct physical contact with a drain electrode of the third-second transistor has a second width that is smaller than the first width, wherein the semiconductor region of the third-second transistor has a shape that tapers in a non-linear manner from the first width to the second width.

2. The display device of claim 1, wherein one side of a gate electrode of the third-second transistor disposed adjacent to the source electrode of the third-second transistor has the first width, and another side of the gate electrode of the third-second transistor disposed adjacent to the drain electrode of the third-second transistor has the second width.

3. The display device of claim 1, wherein one side of a semiconductor region of the third-first transistor disposed in direct physical contact with the source electrode of the third-first transistor has a third width, and another side of the semiconductor region of the third-first transistor disposed in direct physical contact with a drain electrode of the third-first transistor has a fourth width that is greater than the third width.

4. The display device of claim 3, wherein one side of a gate electrode of the third-first transistor disposed adjacent to the source electrode of the third-first transistor has the third width, and another side of the gate electrode of the third-first transistor disposed adjacent to the drain electrode of the third-first transistor has the fourth width.

5. The display device of claim 1, further comprising:
a driving voltage line for supplying a driving voltage;
a first capacitor connected between the gate electrode of the driving transistor and the driving voltage line; and
a second capacitor connected between the source electrode of the third-first transistor and the driving voltage line.

6. The display device of claim 5, wherein a first capacitor electrode of the second capacitor is formed as one body with the source electrode of the third-first transistor and the drain electrode of the third-second transistor, and the second capacitor electrode of the second capacitor is disposed on the first capacitor electrode of the second capacitor and electrically connected to the driving voltage line.

7. The display device of claim 5, further comprising:
a first initialization voltage line supplying a first initialization voltage;
a second initialization voltage line supplying a second initialization voltage;
a fourth-first transistor connected to the gate electrode of the driving transistor;
a fourth-second transistor connected between a drain electrode of the fourth-first transistor and the first initialization voltage line;

a fifth transistor connected between the driving voltage line and the source electrode of the driving transistor;

a sixth transistor connected between the drain electrode of the driving transistor and a first electrode of the light-emitting element; and a seventh transistor connected between the first electrode of the light-emitting element and the second initialization voltage line.

8. The display device of claim 7, further comprising:

a bias voltage line supplying a bias voltage; and an eighth transistor connected between the bias voltage line and the source electrode of the driving transistor.

9. The display device of claim 7, further comprising:

a first gate line supplying a first gate signal to a gate electrode of the second transistor;

a second gate line supplying a second gate signal to a gate electrode of the third-first transistor and a gate electrode of the third-second transistor, which are formed as one body;

a third gate line supplying a third gate signal to a gate electrode of the fourth-first transistor and a gate electrode of the fourth-second transistor, which are integrally formed;

an emission control line supplying an emission signal to a gate electrode of the fifth transistor and a gate electrode of the sixth transistor; and a fourth gate line supplying a fourth gate signal to a gate electrode of the seventh transistor.

\* \* \* \* \*